(12) United States Patent
Kubo

(10) Patent No.: US 10,847,616 B2
(45) Date of Patent: Nov. 24, 2020

(54) SEMICONDUCTOR DEVICE, METHOD OF MANUFACTURING SEMICONDUCTOR DEVICE, AND SEMICONDUCTOR PACKAGE

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/366,121

(22) Filed: Mar. 27, 2019

(65) Prior Publication Data
US 2019/0305086 A1    Oct. 3, 2019

(30) Foreign Application Priority Data
Mar. 29, 2018    (JP) .................................. 2018-064796

(51) Int. Cl.
*H01L 29/10*    (2006.01)
*H01L 23/31*    (2006.01)
(Continued)

(52) U.S. Cl.
CPC ...... *H01L 29/107* (2013.01); *H01L 21/26513* (2013.01); *H01L 21/304* (2013.01);
(Continued)

(58) Field of Classification Search
CPC ............... H01L 29/107; H01L 23/3114; H01L 23/49513; H01L 23/4952; H01L 29/66734; H01L 29/7802; H01L 29/7813; H01L 21/26513; H01L 21/304; H01L 29/66712; H01L 29/41741; H01L 2224/0603; H01L 2224/48247; H01L 2224/48091;
(Continued)

(56) References Cited

U.S. PATENT DOCUMENTS

| 2011/0233684 A1* | 9/2011 | Matsushita ......... H01L 29/1095 257/378 |
| 2012/0169262 A1* | 7/2012 | Nakajima ........... H01L 27/0883 318/400.27 |

(Continued)

FOREIGN PATENT DOCUMENTS

JP    2013-055739 D1    3/2013

*Primary Examiner* — Yasser A Abdelaziez
(74) *Attorney, Agent, or Firm* — Gregory M. Howison

(57) ABSTRACT

A semiconductor device includes: semiconductor layer having first and second surfaces; first base region of first conductivity type formed in the semiconductor layer; second base region of second conductivity type adjacent to the first base region and formed in the semiconductor layer; first surface region of the second conductivity type selectively formed in the first base region; second surface region of the first conductivity type selectively formed in the second base region separate from the first base region; gate electrode facing portion of the first base region between boundary between the first and second base regions and the first surface region and portion of the second base region between the boundary and the second surface region, the gate electrode extending across the boundary; first and second electrodes connected to the first and second surface regions respectively; and third electrode connected in common to the first and second base regions.

13 Claims, 20 Drawing Sheets

(51) Int. Cl.
  *H01L 23/495*  (2006.01)
  *H01L 29/66*   (2006.01)
  *H01L 29/78*   (2006.01)
  *H01L 21/265*  (2006.01)
  *H01L 21/304*  (2006.01)
  *H01L 29/417*  (2006.01)

(52) U.S. Cl.
  CPC ...... *H01L 23/3114* (2013.01); *H01L 23/4952* (2013.01); *H01L 23/49513* (2013.01); *H01L 23/49562* (2013.01); *H01L 29/41741* (2013.01); *H01L 29/66712* (2013.01); *H01L 29/66734* (2013.01); *H01L 29/7802* (2013.01); *H01L 29/7813* (2013.01)

(58) Field of Classification Search
  CPC ....... H01L 23/3107; H01L 2224/49111; H01L 29/1095; H01L 29/0882; H01L 29/7803
  See application file for complete search history.

(56) References Cited

U.S. PATENT DOCUMENTS

2013/0105889 A1* 5/2013 Fujiwara ........... H01L 29/66068
                                                   257/330
2019/0140093 A1* 5/2019 Okumura ............ H01L 29/1095

* cited by examiner

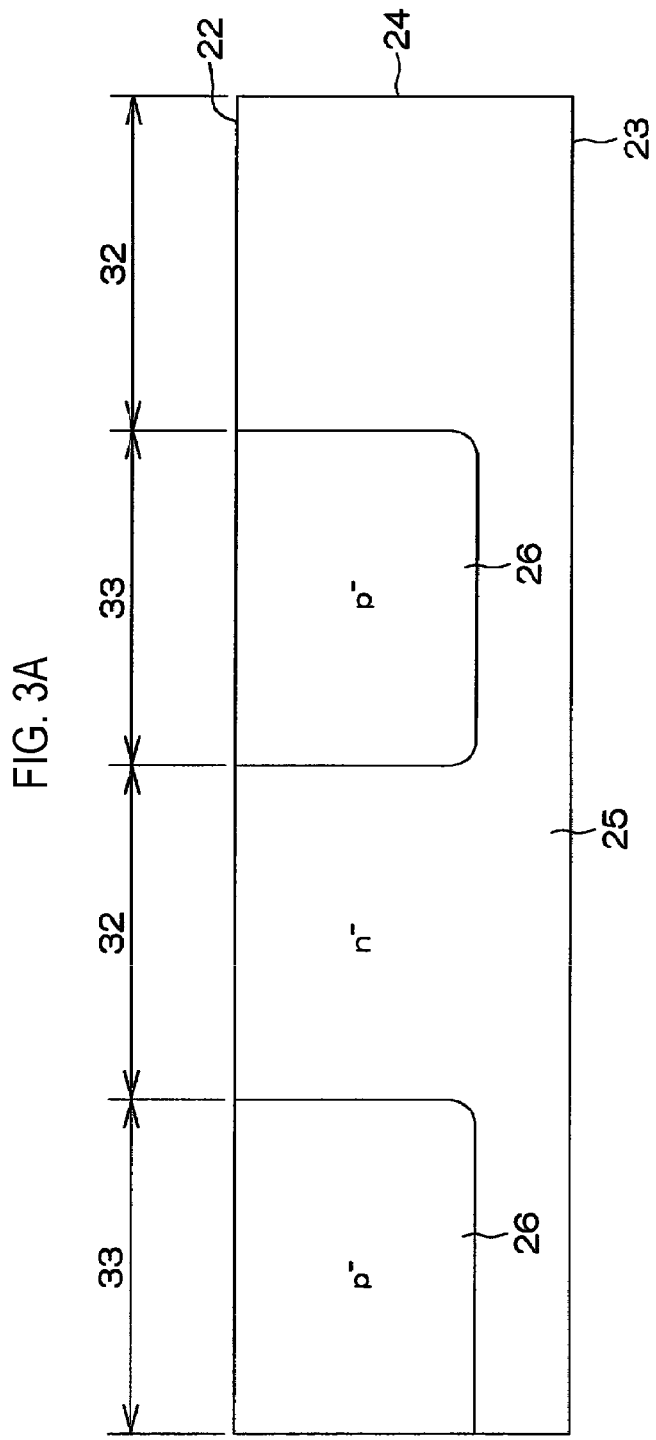

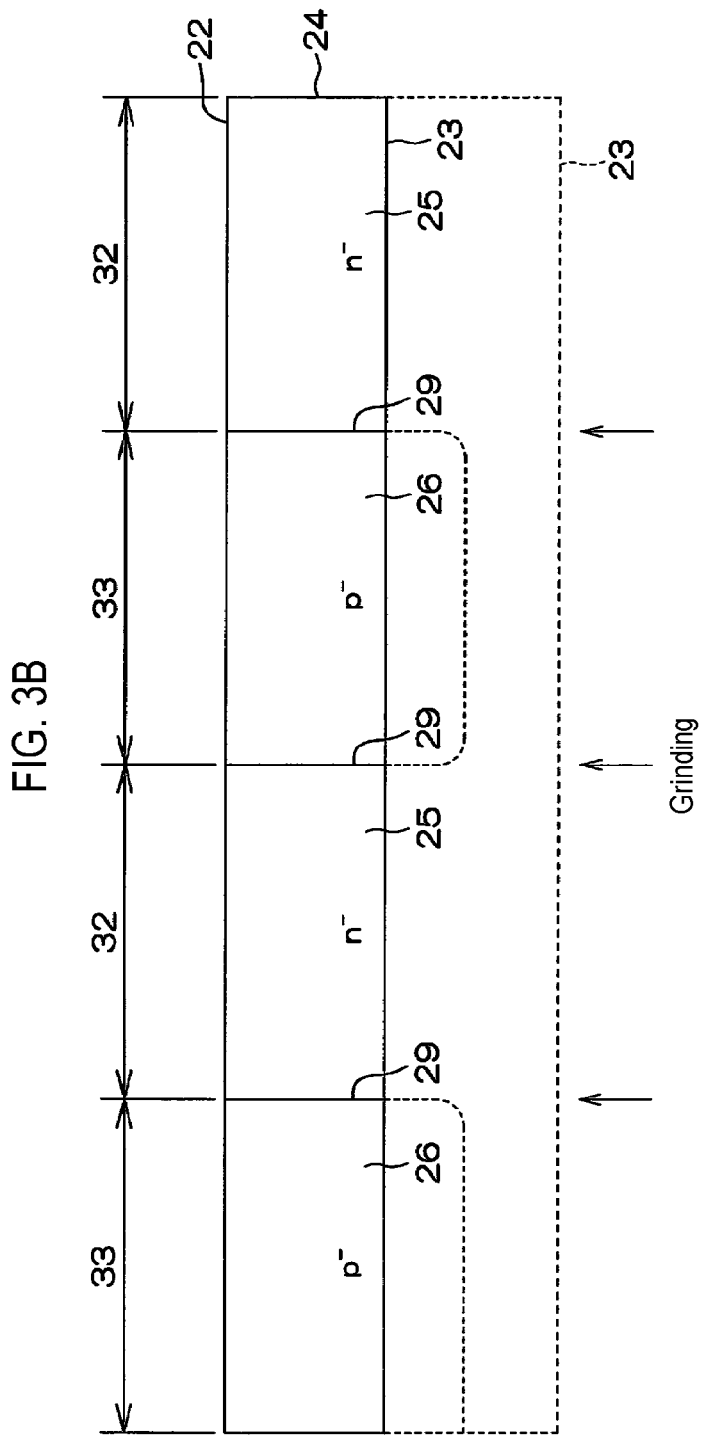

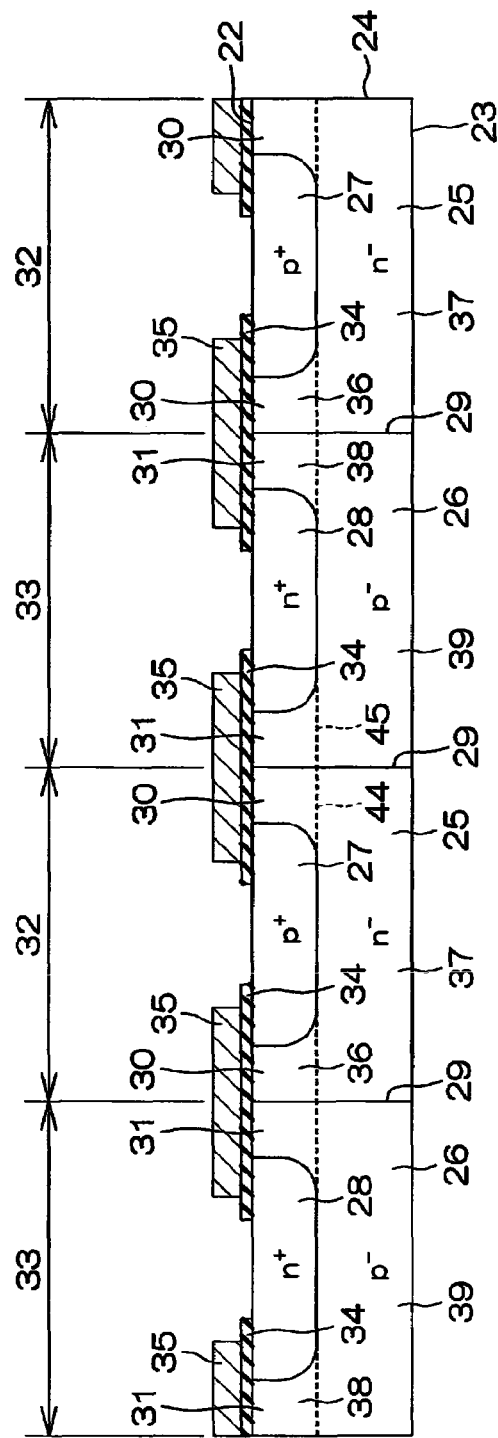

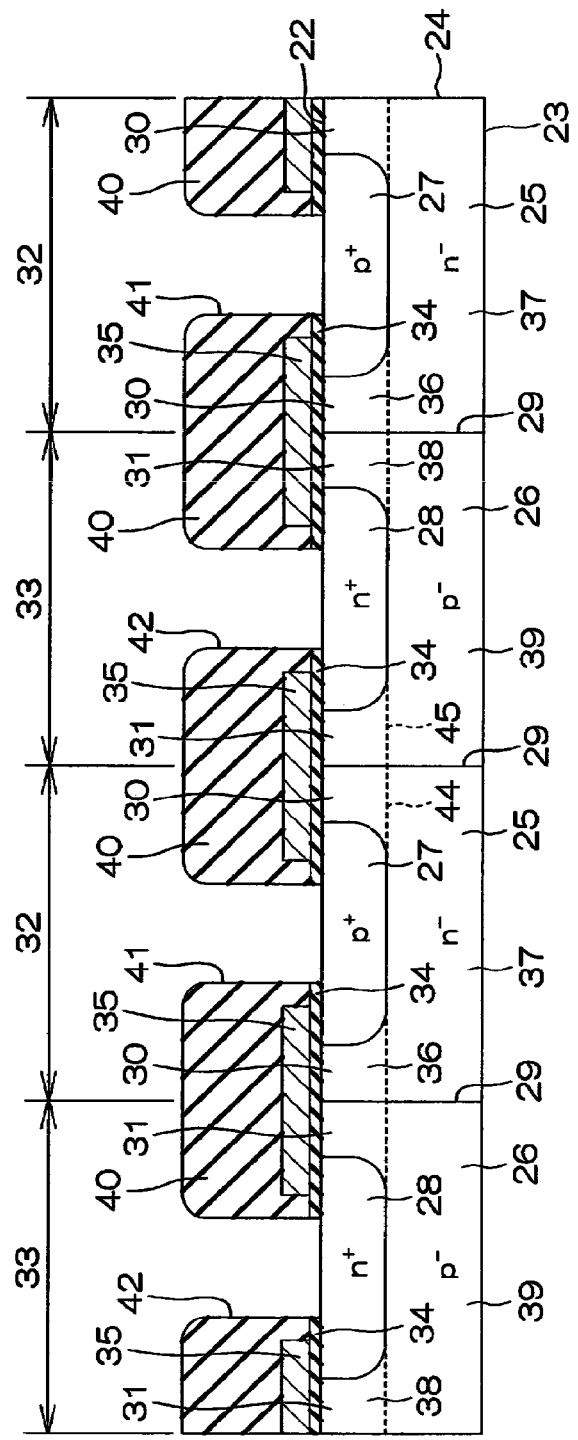

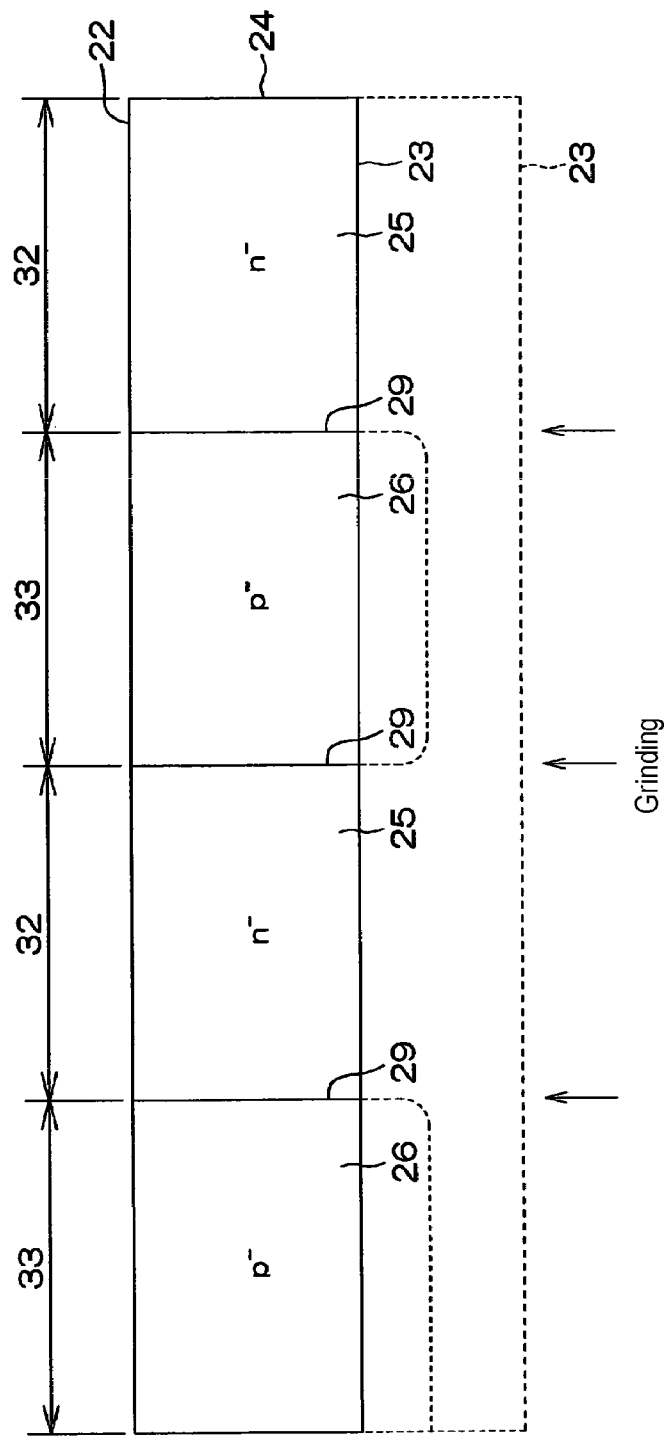

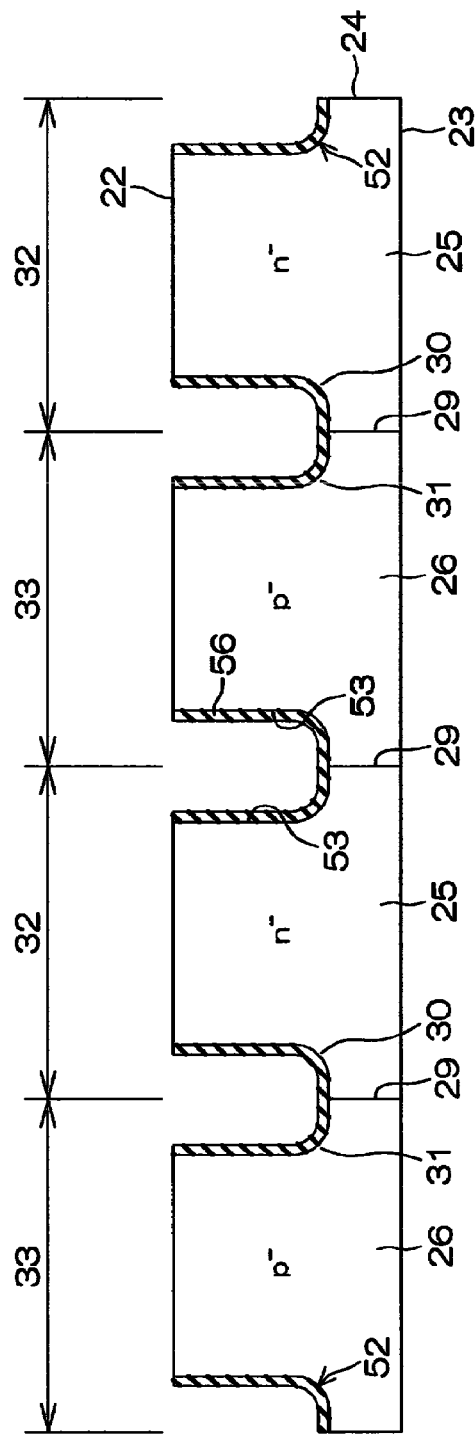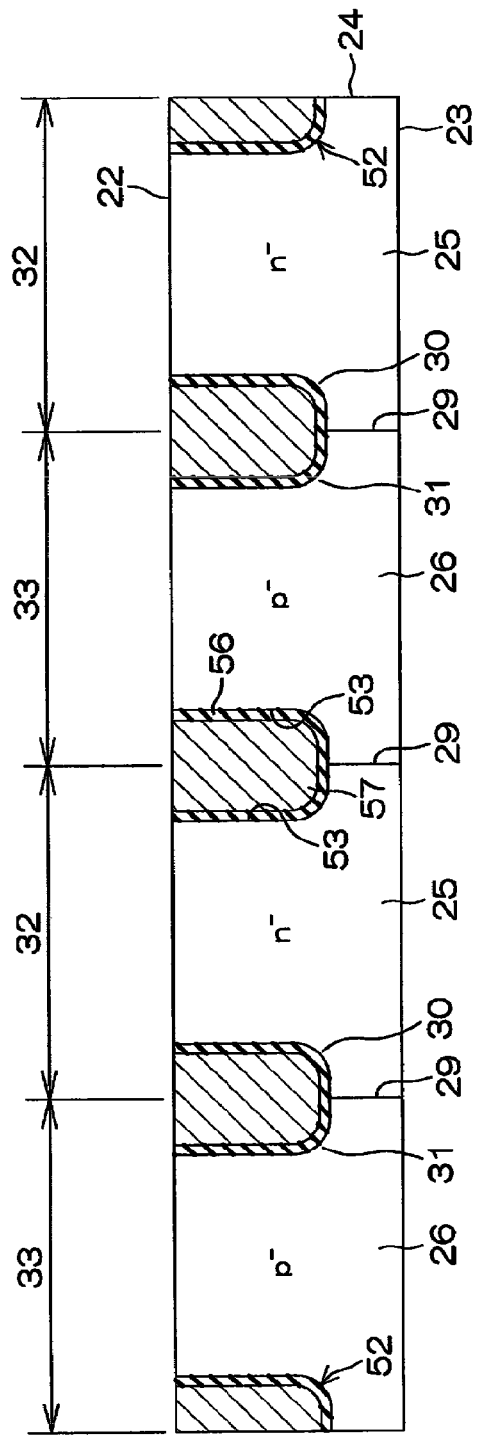

SEMICONDUCTOR DEVICE, METHOD OF MANUFACTURING SEMICONDUCTOR DEVICE, AND SEMICONDUCTOR PACKAGE

CROSS-REFERENCE TO RELATED APPLICATIONS

This application is based upon and claims the benefit of priority from Japanese Patent Application No. 2018-064796, filed on Mar. 29, 2018, the entire contents of which are incorporated herein by reference.

TECHNICAL FIELD

The present disclosure relates to a semiconductor device and a manufacturing method thereof, and a semiconductor package including the semiconductor device.

BACKGROUND

In the related art, a three-phase inverter circuit is disclosed and includes three n-side power semiconductor elements and three p-side power semiconductor elements, with the three n-side power semiconductor elements being respectively connected to the three p-side power semiconductor elements in series to form three arm circuits.

In an inverter circuit such as that in the related art, a pause period (dead time) at which both upper and lower elements are turned off is usually prepared at a timing when ON and OFF of the upper and lower elements are switched so that the upper and lower elements are not turned on at the same time.

However, it is difficult to properly adjust a length of dead time, and power loss may occur if the dead time is too long. In addition, since one element is turned off while the other element is turned on, the elements need to be designed in consideration of off-withstand voltage. For example, the off-withstand voltage can be improved by thickening a substrate of the element, but on-resistance becomes high on the other hand.

SUMMARY

Some embodiments of the present disclosure provide a semiconductor device capable of shortening a dead time and reducing on-resistance, and a manufacturing method thereof.

According to an embodiment of the present disclosure, there is provided a semiconductor device. The semiconductor device includes: a semiconductor layer having a first surface and a second surface opposite the first surface; a first base region of a first conductivity type formed in the semiconductor layer; a second base region of a second conductivity type adjacent to the first base region and formed in the semiconductor layer; at least one first surface region of the second conductivity type selectively formed in the first base region separate from the second base region; at least one second surface region of the first conductivity type selectively formed in the second base region separate from the first base region; a gate electrode configured to face a portion of the first base region between a boundary between the first base region and the second base region and the at least one first surface region and a portion of the second base region between the boundary and the at least one second surface region, the gate electrode extending across the boundary between the first base region and the second base region; a first electrode electrically connected to the at least one first surface region; a second electrode electrically connected to the at least one second surface region; and a third electrode electrically connected in common to the first base region and the second base region.

For example, a case is considered where the first conductivity type is an n-type and the second conductivity type is a p-type. In this case, each configuration of the present disclosure may defined such that the first base region is the n-type base region, the second base region is the p-type base region, the first surface region is the p-type surface region, and the second surface region is the n-type surface region. Thus, an n-channel transistor including a portion facing the gate electrode of the n-type base region and the p-type base region, and the n-type surface region, and a p-channel transistor including a portion facing the gate electrode of the p-type base region and the n-type base region, and the p-type surface region are formed in the semiconductor layer.

For example, when a power supply is connected between the second electrode and the third electrode with the first electrode at a ground potential, the second electrode at a high potential side, and the third electrode at a low potential side, in the n-channel transistor, a reverse bias is applied to a pn junction (parasitic diode) between the n-type surface region and the p-type base region. On the other hand, in the p-channel transistor, a reverse bias is applied to a pn junction (parasitic diode) between the p-type surface region and the n-type base region. At this time, when a control voltage (absolute value) lower than threshold voltages of the n-channel transistor and the p-channel transistor is applied to the gate electrode, no current path is formed between the first electrode and the third electrode and between the second electrode and the third electrode.

From this state, for example, when a positive voltage (Vg>0) greater than or equal to the threshold voltage of the n-channel transistor is applied to the gate electrode, electrons are attracted to a portion of the p-type base region that is opposite to the gate electrode to form an inversion layer (channel). Thus, the n-type surface region and the n-type base region are electrically conducted. That is, a current path is formed from the second electrode to the third electrode through the n-type surface region, the inversion layer, and the n-type base region in this order. That is, the semiconductor device is turned on.

On the other hand, for example, when a negative voltage (Vg<0) less than or equal to the threshold voltage of the p-channel transistor is applied to the gate electrode, holes are attracted to a portion of the n-type base region facing the gate electrode to form an inversion layer (channel). Thus, the p-type surface region and the p-type base region are electrically conducted. That is, a current path is formed from the third electrode to the first electrode through the p-type base region, the inversion layer, and the p-type surface region in this order. That is, the semiconductor device is turned on.

Since the switching between the n-channel transistor and the p-channel transistor can be quickly performed only by inverting the polarity of the voltage applied to the gate electrode between positive and negative in this manner, it is possible to shorten a dead time occurring between ON of the n-channel transistor and ON of the p-channel transistor. Therefore, since the time for which an OFF voltage is applied between the first surface and the second surface of the semiconductor layer can be shortened, it is possible to provide a semiconductor device having a lower withstand voltage design compared with the related art. Thus, since a thickness of the semiconductor layer can be reduced, it is possible to reduce on-resistance of the semiconductor device.

In some embodiments, the at least one first surface region may be selectively formed on the first surface of the first base region, the first base region may include a first surrounding region surrounded by the boundary between the first base region and the second base region, the gate electrode, and the at least one first surface region, and the first surrounding region may have an impurity concentration higher than that of a region of the first base region other than the first surrounding region.

With this configuration, it is possible to provide a time delay until the inversion layer is formed by increasing the impurity concentration of the portion where the inversion layer of the transistor is formed. Thus, it is possible to prevent both transistors from being turned on when the gate voltage crosses 0 V which is a boundary between a positive value and a negative value.

In addition, the distance between the first surface region and the second base region is relatively short at a portion sandwiching the first surrounding region. Thus, by increasing the impurity concentration of the first surrounding region, it is possible to suppress occurrence of a phenomenon (bipolar action) that an overcurrent flows through a parasitic bipolar transistor formed by the first surface region (the second conductivity type), the first base region (the first conductivity type), the second base region (the second conductivity type).

In some embodiments, the impurity concentration of the first surrounding region may be $1.0 \times 10^{14}$ to $1.0 \times 10^{16}$ cm$^{-3}$, and the impurity concentration of the region of the first base region other than the first surrounding region may be $1.0 \times 10^{13}$ to $1.0 \times 10^{15}$ cm$^{-3}$.

In some embodiments, the at least one second surface region may be selectively formed on the first surface of the second base region, the second base region may include a second surrounding region surrounded by the boundary between the first base region and the second base region, the gate electrode, and the at least one second surface region, and the second surrounding region may have an impurity concentration higher than that of a region of the second base region other than the second surrounding region.

With this configuration, it is possible to provide a time delay until the inversion layer is formed by increasing the impurity concentration of the portion where the inversion layer of the transistor is formed. Thus, it is possible to prevent both transistors from being turned on when the gate voltage crosses 0 V which is a boundary between a positive value and a negative value.

Furthermore, the distance between the second surface region and the first base region is relatively short at a portion sandwiching the second surrounding region. Thus, by increasing the impurity concentration of the second surrounding region, it is possible to suppress occurrence of a phenomenon (bipolar action) that an overcurrent flows through a parasitic bipolar transistor formed by the second surface region (the first conductivity type)—the second base region (the second conductivity type)—the first base region (the first conductivity type).

In some embodiments, the impurity concentration of the second surrounding region may be $1.0 \times 10^{14}$ to $1.0 \times 10^{16}$ cm$^{-3}$, and the impurity concentration of the region of the second base region other than the second surrounding region may be $1.0 \times 10^{13}$ to $1.0 \times 10^{15}$ cm$^{-3}$.

In some embodiments, both the first base region and the second base region may be formed so as to be exposed on the second surface of the semiconductor layer, and the third electrode may be formed in the second surface of the semiconductor layer so as to extend across the boundary between the first base region and the second base region.

In some embodiments, the gate electrode may include a gate electrode of a planar gate structure.

In some embodiments, the gate electrode may include a gate electrode of a trench gate structure.

In some embodiments, the at least one first surface region may include a plurality of first surface regions, and the at least one second surface region may include a plurality of second surface regions, and the device may have a stripe structure in which the plurality of first surface regions and the plurality of second surface regions may be alternately arranged.

In some embodiments, the first electrode may include a first base part extending in a direction intersecting the plurality of first surface regions and a first extension part extending from the first base part along each of the plurality of first surface regions and connected to each of the plurality of first surface regions, the second electrode may include a second base part extending in a direction intersecting the plurality of second surface regions and a second extension part extending from the second base part along each of the plurality of second surface regions and connected to each of the plurality of second surface regions, and the first electrode and the second electrode may be engaged with each other in a comb shape.

In some embodiments, the semiconductor layer may have a thickness of 3 to 50 µm.

According to an embodiment of the present disclosure, there is provided a semiconductor package. The package includes: the semiconductor device; a first terminal electrically connected to the first electrode; a second terminal electrically connected to the second electrode; a third terminal electrically connected to the third electrode; a fourth terminal electrically connected to the gate electrode; and a resin package configured to seal the semiconductor device and the first to fourth terminals.

According to this configuration, since the semiconductor device is provided, it is possible to realize an element capable of alternately turning on and off a high-side switch and a low-side switch in, for example, an inverter circuit, in one package.

According to an embodiment of the present disclosure, there is provided a method of manufacturing a semiconductor device. The method includes: selectively implanting an impurity of a second conductivity type into a first surface of a semiconductor layer of a first conductivity type having the first surface and a second surface opposite the first surface to form a second base region exposed on the first surface of the semiconductor layer and a first base region including a region of the semiconductor layer other than the second base region; exposing the first base region and the second base region on the second surface of the semiconductor layer by removing the semiconductor layer from the second surface; forming a first surface region of a second conductivity type on the first surface of the first base region so as to be separate from the second base region; forming a second surface region of a first conductivity type on the first surface of the second base region so as to be separate from the first base region; forming a gate electrode configured to face a portion of the first base region between a boundary between the first base region and the second base region and the first surface region and a portion of the second base region between the boundary and the second surface region so as to extend across the boundary between the first base region and the second base region; forming a first electrode electrically connected to the first surface region; forming a second electrode electrically connected to the second surface region; and forming a third electrode on the second surface of the semiconductor layer so as to extend across a boundary between the first base region and the second base region.

According to this method, the semiconductor device can be manufactured.

BRIEF DESCRIPTION OF THE DRAWINGS

For a more complete understanding, reference is now made to the following description taken in conjunction with the accompanying Drawings in which:

FIG. 3A is a diagram illustrating a part of a manufacturing process of the semiconductor device in FIG. 2.

FIG. 3B is a view illustrating a next step of FIG. 3A.
FIG. 3E is a view illustrating a next step of FIG. 3D.
FIG. 3F is a view illustrating a next step of FIG. 3E.
FIG. 11B is a view illustrating a next step of FIG. 11A.
FIG. 11D is a view illustrating a next step of FIG. 11C.
FIG. 11E is a view illustrating a next step of FIG. 11D.

DETAILED DESCRIPTION

Embodiments of the present disclosure will now be described in detail with reference to the drawings.

Figure 1:
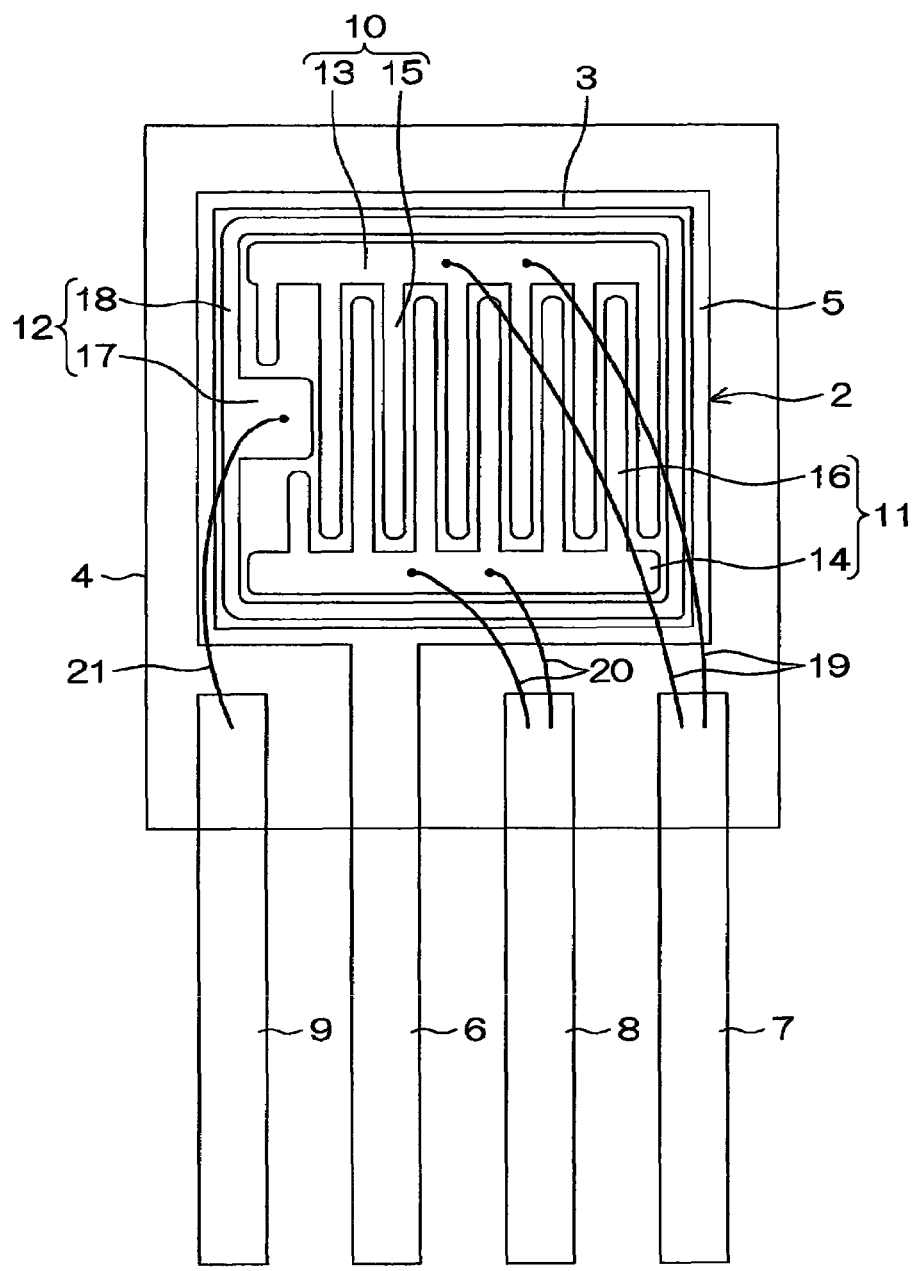
FIG. 1 is a schematic overall view of a semiconductor package according to one embodiment of the present disclosure.

FIG. 1 is a schematic overall view of a semiconductor package 1 according to one embodiment of the present disclosure. Further, in FIG. 1, the inside of the semiconductor package 1 is transparently illustrated.

The terminal frame 2 is formed in a metal plate shape. The terminal frame 2 has a square shape, and includes a base part 5 supporting the semiconductor device 3, a third terminal 6 that is integrally formed with the base part 5, and a first terminal 7, a second terminal 8, and a fourth terminal 9, which are formed separately from the base part 5.

The first terminal 7, the second terminal 8, and the fourth terminal 9 are formed in a linear fashion, when viewed from the plane, each having one end and the other end, and the first terminal 7, the second terminal 8, the third terminal 6, and the fourth terminal 9 are sequentially arranged in parallel to each other. Among these terminals 6 to 9, only one end of the third terminal 6 integrated with the base part 5 is connected to the base part 5. Among the remaining terminals 7 to 9, the fourth terminal 9 is arranged such that one end thereof faces one corner portion of the base part 5 adjacent to a connection position of the third terminal 6. The first terminal 7 is arranged to face the other corner portion of the base part 5. The second terminal 8 is arranged between the first terminal 7 and the third terminal 6.

The semiconductor device 3 includes a first electrode film 10, a second electrode film 11, and a gate electrode film 12. The first electrode film 10, the second electrode film 11, and the gate electrode film 12 are made of aluminum or any other metal.

The first electrode film 10 and the second electrode film 11 include a linear first base part 13 and a second base part 14 extending in parallel to each other, respectively. A plurality of linear first extension parts 15 extend in parallel to each other from the first base part 13 toward the second base part 14. A plurality of linear second extension parts 16 extend in regions between the respective adjacent first extension parts 15 from the second base part 14 toward the first base part 13. The first extension parts 15 and the second extension parts 16 are alternately arranged in parallel to each other, such that the first electrode film 10 and the second electrode film 11 are engaged with each other in a comb shape.

The gate electrode film 12 includes a gate pad 17 and a gate finger 18.

The gate pad 17 is formed in a square shape and is arranged near one side surface of the semiconductor device 3. The gate finger 18 is formed in a square annular shape along the side surface of the semiconductor device 3 from the gate pad 17 so as to surround the first electrode film 10 and the second electrode film 11.

The first base part 13 of the first electrode film 10 and the first terminal 7 are electrically connected by a first wire 19. The second base part 14 of the second electrode film 11 and the second terminal 8 are electrically connected by a second wire 20. The gate pad 17 of the gate electrode film 12 and the fourth terminal 9 are electrically connected by a fourth wire 21. The first wire 19, the second wire 20, and the fourth wire 21 may be formed as, for example, a known bonding wire such as an Au wire, a Cu wire, or the like. Furthermore, the first wire 19, the second wire 20, and the fourth wire 21 may be only one or a plurality of wires, respectively.

Furthermore, although not shown in FIG. 1, a third electrode 43 as described later is electrically connected to the base part 5 (the third terminal 6) by a binder such as solder or the like.

The resin package 4, which forms an outer shape of the semiconductor package 1, is formed in a substantially rectangular parallelepiped shape. The resin package 4 is made of, for example, a known mold resin such as an epoxy resin, and covers the base part 5, the first wire 19, the second wire 20, and the fourth wire 21 of the terminal frame 2 together with the semiconductor device 3 and seals the semiconductor device 3 so as to expose the four terminals (the first terminal 7, the second terminal 8, the third terminal 6, and the fourth terminal 9).

Figure 2:
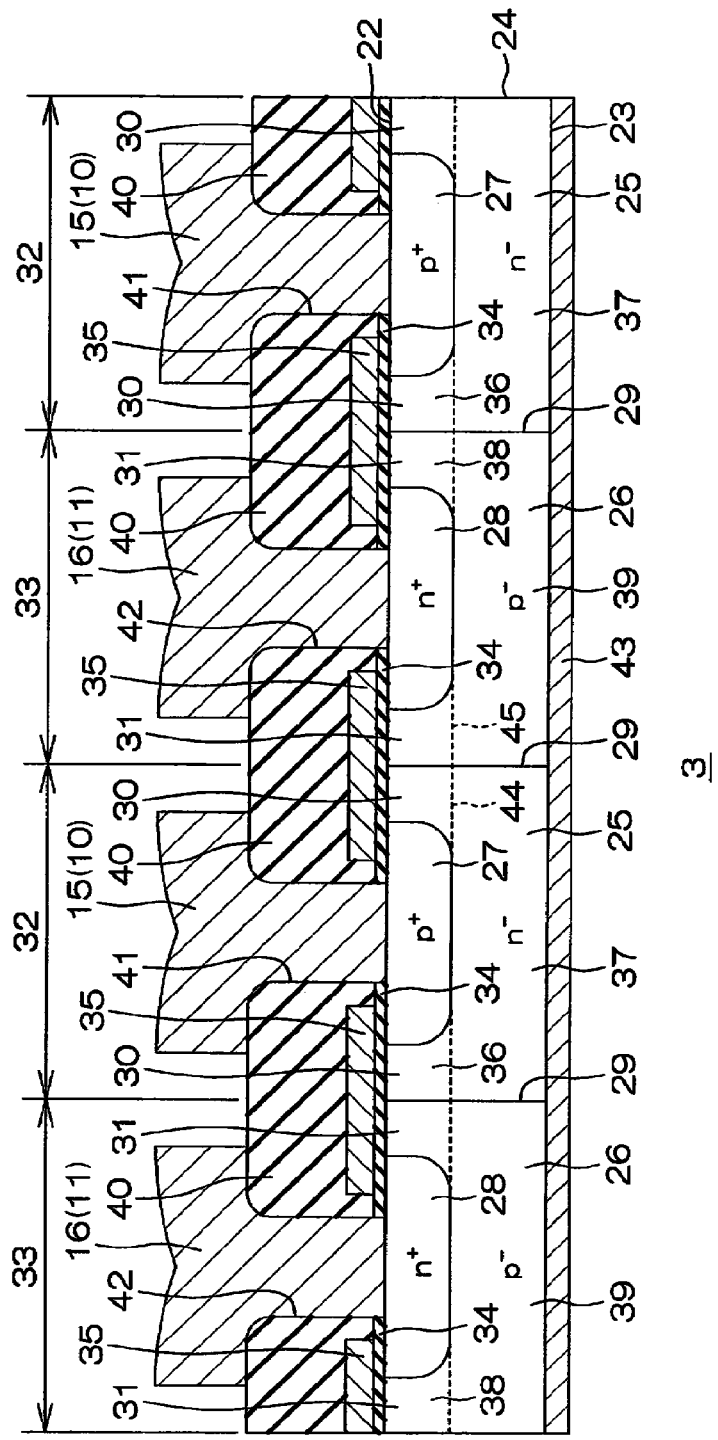
FIG. 2 is a schematic cross-sectional view of a semiconductor device according to one embodiment of the present disclosure.

FIG. 2 is a schematic cross-sectional view of the semiconductor device 3 according to one embodiment of the present disclosure.

The semiconductor device 3 includes a semiconductor layer 24 having a first surface 22 and a second surface 23 opposite the first surface 22. The semiconductor layer 24 may be formed of, for example, a Si substrate, or may be formed of any other semiconductor substrate such as a SiC substrate, a GaN substrate or the like. In addition, the first surface 22 and the second surface 23 of the semiconductor layer 24 may be respectively referred to as a surface and a rear surface of the semiconductor layer 24, from a state of the semiconductor device 3 mounted on the terminal frame 2 (see FIG. 1). Furthermore, a thickness of the semiconductor layer 24 may be, for example, 3 to 50 μm.

An n⁻ type base region 25 as an example of a first base region of the present disclosure and a p⁻ type base region 26 as an example of a second base region of the present disclosure are formed in the semiconductor layer 24. The n⁻ type base region 25 and the p⁻ type base region 26 are formed so as to extend from the first surface 22 to the second surface 23 of the semiconductor layer 24, and are exposed on both the first surface 22 and the second surface 23. In addition, the n⁻ type base region 25 and the p⁻ type base region 26 are adjacently arranged so as to make contact with each other. In this embodiment, a plurality of n⁻ type base regions 25 and a plurality of p⁻ type base regions 26 are alternately arranged adjacent to each other so as to form a stripe structure.

Furthermore, phosphorus (P), arsenic (As), antimony (SB), or the like may be used as an n-type impurity contained in the n⁻ type base region 25. In addition, boron (B), aluminum (Al), gallium (Ga), or the like may be used as a p-type impurity contained in the p⁻ type base region 26. The same may apply to impurities contained in n-type and p-type semiconductor layers (semiconductor regions) illustrated below.

A p⁺ type surface region 27 as an example of a first surface region of the present disclosure is formed on a surface portion (first surface 22) of each n⁻ type base region 25. The p⁺ type surface region 27 is formed in the n⁻ type base region 25 so as to be located inside a boundary 29 (a boundary on both sides of the stripe) between the n⁻ type base region 25 and the p⁻ type base region 26 by a predetermined distance. Thus, a surface portion of the n⁻ type base region 25 is interposed between the p⁺ type surface region 27 and the p⁻ type base region 26 in the surface portion of the semiconductor layer 24 including the n⁻ type base region 25 and the p⁺ type surface region 27, and provides a first channel region 30. Accordingly, a p-channel transistor 32, which operates by forming a p-type inversion layer in the n⁻ type first channel region 30, is formed in the n⁻ type base region 25.

On the other hand, an n⁺ type surface region 28 as an example of a second surface region of the present disclosure is formed on a surface portion (first surface 22) of each p⁻ type base region 26. The n⁺ type surface region 28 is formed in the p⁻ type base region 26 so as to be located inside the boundary 29 (a boundary on both sides of the stripe) between the n⁻ type base region 25 and the p⁻ type base region 26 by a predetermined distance. Thus, a surface portion of the p⁻ type base region 26 is interposed between the n⁺ type surface region 28 and the n⁻ type base region 25 in the surface portion of the semiconductor layer 24 including the p⁻ type base region 26 and the n⁺ type surface region 28, and provides a second channel region 31. Accordingly, an n-channel transistor 33, which operates by forming an n-type inversion layer in the p⁻ type second channel region 31, is formed in the p⁻ type base region 26.

In this embodiment, a plurality of p⁺ type surface regions 27 and a plurality of n⁺ type surface regions 28 are respectively arranged immediately below the first extension parts 15 of the first electrode film 10 and the second extension parts 16 of the second electrode film 11 to form a stripe structure alternately arranged with respect to each other as a whole. The first channel regions 30 and the second channel regions 31 form a stripe structure according to the shapes of the p⁺ type surface regions 27 and the n⁺ type surface regions 28.

Furthermore, in this embodiment, the p⁺ type surface regions 27 and the n⁺ type surface regions 28 may have the same depth or different depths. The depth of the p⁺ type surface regions 27 is, for example, 1 to 5 μm, and the depth of the n⁺ type surface regions 28 is, for example, 1 to 5 μm.

Gate insulating films 34 are formed on the first surface 22 of the semiconductor layer 24. Each of the gate insulating films 34 is formed so as to cover at least the surfaces of the n⁻ type base region 25 in the first channel region 30 and the p⁻ type base region 26 in the second channel region 31, extending between the p-channel transistor 32 and the n-channel transistor 33. In this embodiment, the gate insulating film 34 is formed so as to cover a part of the surface of the p⁺ type surface region 27, and a part of the surfaces of the first channel region 30, the second channel region 31 and the n⁺ type surface region 28. That is, the gate insulating film 34 is formed as a gate insulating film common to the first channel region 30 and the second channel region 31, which are adjacent to each other to form a pn junction.

The gate insulating film 34 may be formed as, for example, a silicon oxide film, a silicon nitride film, a silicon oxynitride film, a hafnium oxide film, an alumina film, a tantalum oxide film, or the like. Furthermore, the thickness of the gate insulating film 34 may be, for example, 100 to 10,000 Å.

A gate electrode 35 is formed on the gate insulating film 34. The gate electrode 35 is formed to face the first channel region 30 and the second channel region 31 with the gate insulating film 34 interposed therebetween. The gate electrode 35 may be made of, for example, polysilicon, having low resistance by implanting an impurity.

The gate electrode 35 is formed in substantially the same pattern as the gate insulating film 34 and covers the surface of the gate insulating film 34. More specifically, the gate electrode 35 is arranged above a part of the surface of the p⁺ type surface region 27, and a part of the surfaces of the first channel region 30, the second channel region 31, and the n⁺ type surface region 28. That is, the gate electrode 35 is formed so as to control the p-channel transistor 32 and the n-channel transistor 33 in common. Thus, a planar gate structure is formed.

Regarding the impurity concentration of the semiconductor layer 24, the impurity concentration of the p⁺ type surface region 27 is higher than the impurity concentration of the p⁻ type base region 26, and may be, for example, $1.0 \times 10^{17}$ to $1.0 \times 10^{19}$ cm⁻³. Furthermore, the impurity concentration of the n⁺ type surface region 28 is higher than the impurity concentration of the n⁻ type base region 25, and may be, for example, $1.0 \times 10^{17}$ to $1.0 \times 10^{19}$ cm⁻³.

In addition, the n⁻ type base region 25 may have regions with different impurity concentrations. In this embodiment, it includes an n-type surrounding region 36 partitioned by the boundary 29 between the n⁻ type base region 25 and the p⁻ type base region 26, the gate electrode 35, and the p⁺ type surface region 27, and may have a relatively high impurity concentration. In this embodiment, a region on the first surface 22 side of the semiconductor layer 24 (i.e., a region shallower than a bottom of the p+ type surface region 27) with respect to a depth position at the bottom of the p+ type surface region 27 indicated by a dashed line 44 in FIG. 2 is the n-type surrounding region 36. On the other hand, a region deeper than the bottom of the p+ type surface region 27 other than the n-type surrounding region 36 may be an n− type region 37.

For example, the impurity concentration of the n− type region 37 is a concentration at which the impurity concentration of the n− type base region 25 is maintained, and is, for example, $1.0 \times 10^{13}$ to $1.0 \times 10^{15}$ cm$^{-3}$. On the other hand, the impurity concentration of the n-type surrounding region 36 is higher than the impurity concentration of the n− type region 37, and may be, for example, $1.0 \times 10^{14}$ to $1.0 \times 10^{16}$ cm$^{-3}$.

The p− type base region 26 may have regions with different impurity concentrations. In this embodiment, it may include a p-type surrounding region 38 partitioned by the boundary 29 between the p− type base region 26 and the n− type base region 25, the gate electrode 35, and the n+ type surface region 28, and may have a relatively high impurity concentration. In this embodiment, a region on the first surface 22 side of the semiconductor layer 24 (i.e., a region shallower than the bottom of the n+ type surface region 28) with respect to the depth position at the bottom of the n+ type surface region 28 indicated by a dashed line 45 in FIG. 2 is the p-type surrounding region 38. On the other hand, a region deeper than the bottom of the n+ type surface region 28 other than the p-type surrounding region 38 may be a p− type region 39.

For example, the impurity concentration of the p− type region 39 is a concentration at which the impurity concentration of the p− type base region 26 is maintained, and is, for example, $1.0 \times 10^{13}$ to $1.0 \times 10^{15}$ cm$^{-3}$. On the other hand, the impurity concentration of the p-type surrounding region 38 is higher than the impurity concentration of the p− type region 39, and may be, for example, $1.0 \times 10^{14}$ to $1.0 \times 10^{16}$ cm$^{-3}$.

Interlayer insulating films 40 are formed on the semiconductor layer 24 so as to cover the gate electrodes 35. Each of the interlayer insulating films 40 is made of, for example, a silicon oxide film, a silicon nitride film, or an insulating material such as tetraethoxysilane (TEOS).

A contact hole 41 exposing the p+ type surface region 27 of the p-channel transistor 32 and a contact hole 42 exposing the n+ type surface region 28 of the n-channel transistor 33 are formed in the interlayer insulating film 40. The contact holes 41 and 42 are formed to penetrate the interlayer insulating film 40 and the gate insulating film 34.

The first electrode film 10 is formed so as to selectively cover the surface of the interlayer insulating film 40 and to be embedded in the contact hole 41. In this embodiment, the first extension part 15 of the first electrode film 10 is formed along the p+ type surface region 27 and is ohmic-connected to the p+ type surface region 27 in the contact hole 41.

The second electrode film 11 is formed so as to selectively cover the surface of the interlayer insulating film 40 and to be embedded in the contact hole 42. In this embodiment, the second extension part 16 of the second electrode film 11 is formed along the n+ type surface region 28 and is ohmic-connected to the n+ type surface region 28 in the contact hole 42.

Furthermore, although not shown, the gate electrode film 12 may be ohmic-connected by, for example, the gate finger 18 at both ends of the stripe of the gate electrode 35.

The third electrode 43 is formed on the second surface 23 of the semiconductor layer 24. The third electrode 43 is made of aluminum or any other metal. The third electrode 43 makes contact with the second surface 23 of the semiconductor layer 24 so as to extend across the boundary 29. Thus, the third electrode 43 is ohmic-connected in parallel to the plurality of n− type base regions 25 and the plurality of p− type base regions 26, and is configured so that a current flows through both of the plurality of p-channel transistors 32 and the plurality of n-channel transistors 33.

Next, a manufacturing method of the semiconductor device 3 will be described.

FIGS. 3A to 3G are views illustrating a manufacturing process of the semiconductor device 3 in the order of steps.

To manufacture the semiconductor device 3, for example, referring to FIG. 3A, a p-type impurity is selectively implanted into a first surface 22 of a formation region of an n-channel transistor 33 of an n− type semiconductor layer 24. Thereafter, a p− type base region 26 is formed by performing an annealing treatment (1,000 to 1,200 degrees C.). A region of the n− type semiconductor layer 24 other than the p− type base region 26 is formed as an n− type base region 25. In this state, the p− type base region 26 is selectively formed on a surface portion of the semiconductor layer 24, and an n− type base region 25 spreads between the p− type base region 26 and the second surface 23 of the semiconductor layer 24. That is, the entire second surface 23 of the semiconductor layer 24 is formed as the n− type base region 25.

Next, referring to FIG. 3B, thinning is performed by removing (for example, grinding, polishing, or the like) the semiconductor layer 24 from the second surface 23. This thinning is performed until the p− type base region 26 is exposed on the second surface 23 of the semiconductor layer 24. Thus, the n− type base regions 25 on the second surface 23 side of the semiconductor layer 24 are removed from the p− type base regions 26, and the n− type base regions 25 and the p− type base regions 26 in the stripe form are formed in the semiconductor layer 24.

Figure 3C:
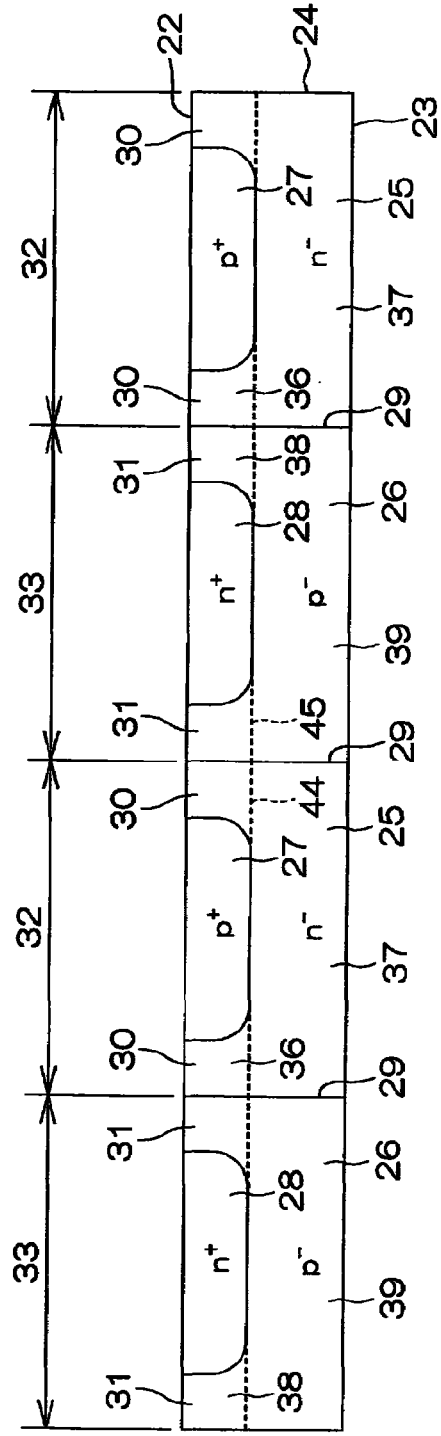
FIG. 3C is a view illustrating a next step of FIG. 3B.

Next, referring to FIG. 3C, a p-type impurity is selectively implanted into a first surface 22 of a formation region of a p-channel transistor 32. Furthermore, an n-type impurity is selectively implanted into the first surface 22 of the formation region of the n-channel transistor 33. Thereafter, a p+ type surface region 27 and an n+ type surface region 28 are formed by performing an annealing treatment (1,000 to 1,200 degrees C.). Thereafter, an n-type impurity and a p-type impurity may be further implanted into the n− type base region 25 and the p− type base region 26 respectively, as necessary, to form an n-type surrounding region 36 and a p-type surrounding region 38.

Figure 3D:
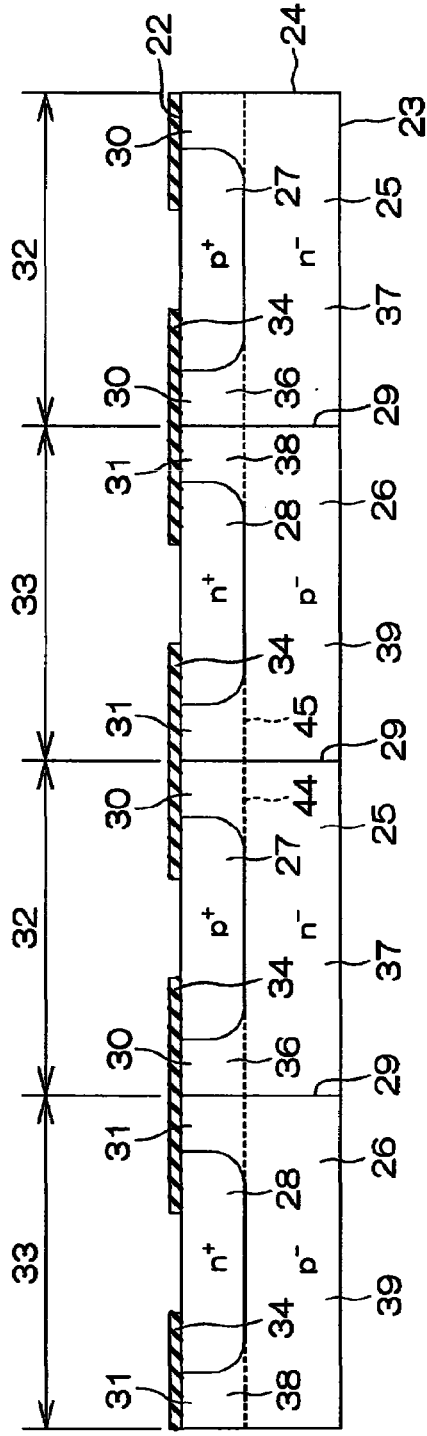
FIG. 3D is a view illustrating a next step of FIG. 3C.

Next, referring to FIG. 3D, gate insulating films 34 are formed on the semiconductor layer 24. Each of the gate insulating films 34 may be formed by thermal oxidation of a semiconductor crystal surface.

Next, referring to FIG. 3E, material of gate electrodes 35 (polysilicon in this embodiment) is deposited on the semiconductor layer 24 while adding an impurity, and then the deposited polysilicon layer is patterned. Thus, the gate electrodes 35 are formed.

Next, referring to FIG. 3F, interlayer insulating films 40 are formed so as to cover the gate electrodes 35, and contact holes 41 are 42 are formed in the interlayer insulating films 40 by photolithography.

Figure 3G:
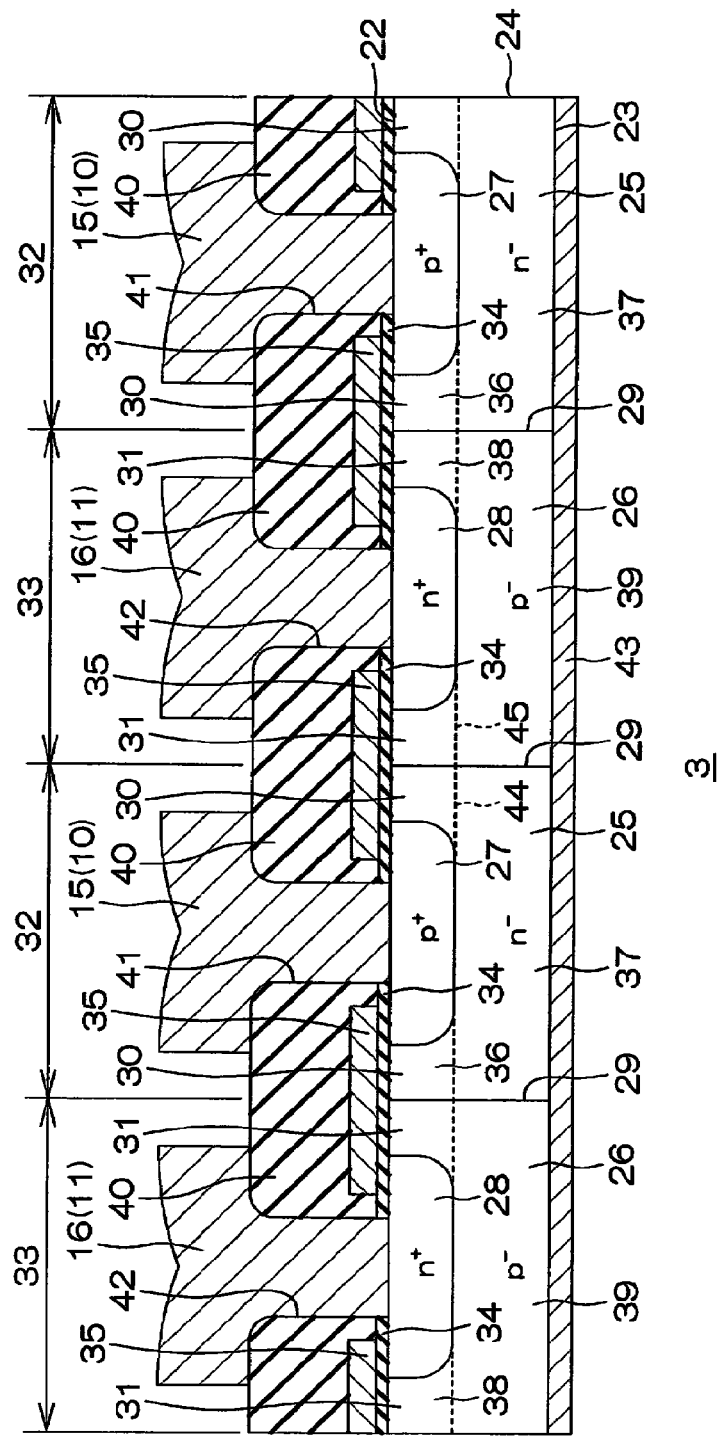
FIG. 3G is a view illustrating a next step of FIG. 3F.

Next, referring to FIG. 3G, a first electrode film 10, a second electrode film 11, and a gate electrode film 12 (not shown) are formed as surface metals on the interlayer insulating films 40. Thereafter, the aforementioned semiconductor device 3 can be obtained by forming a third electrode 43 on the second surface 23 of the semiconductor layer 24.

Figure 4A:
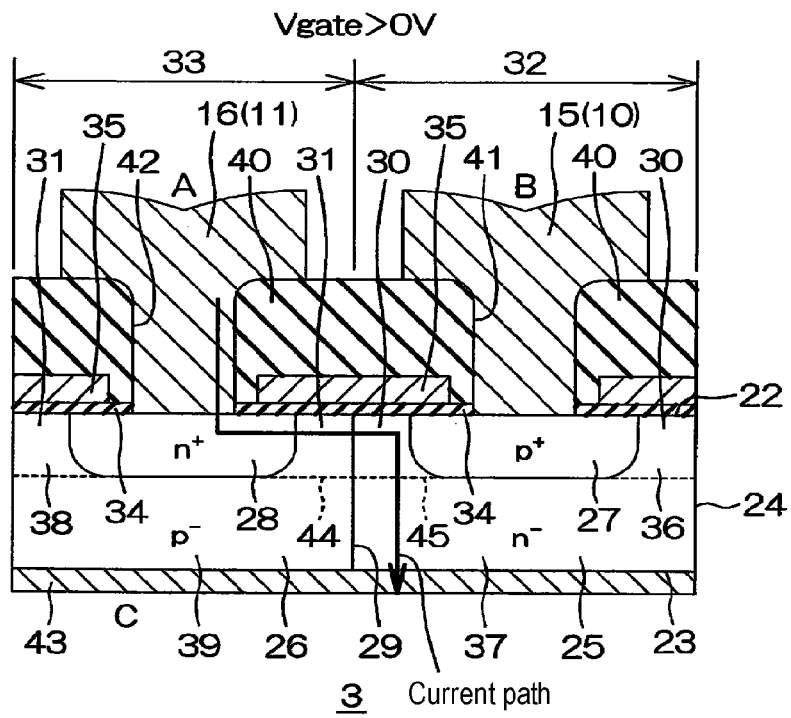
FIGS. 4A and 4B are views illustrating an operation mode of the semiconductor device in FIG. 2.
Figure 4B:
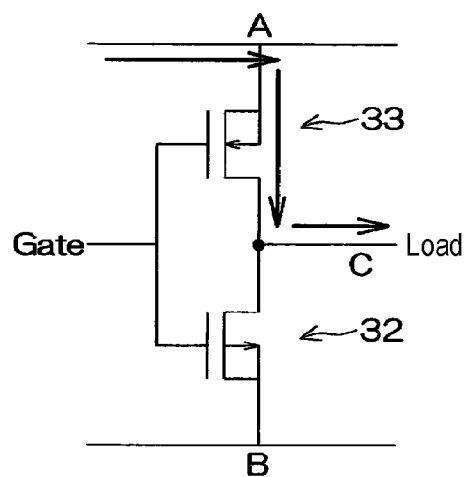
Figure 5A:
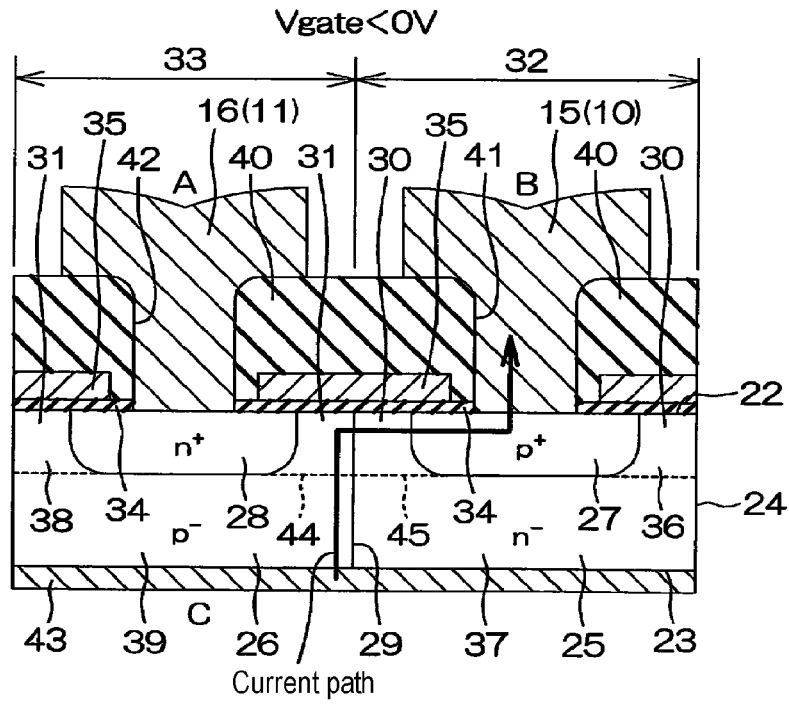
FIGS. 5A and 5B are views illustrating an operation mode of the semiconductor device in FIG. 2.
Figure 5B:
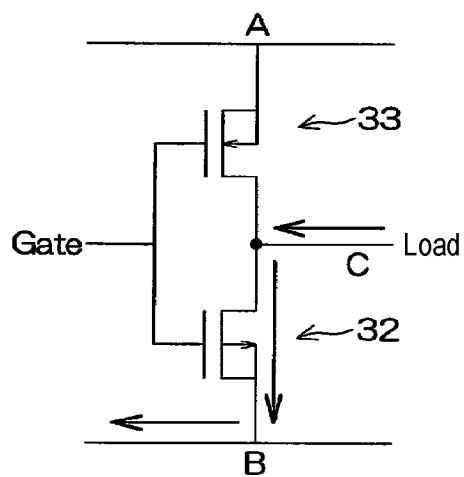

FIGS. 4A and 4B, and FIGS. 5A and 5B are views illustrating operation modes of the semiconductor device in FIG. 2. FIGS. 4A and 4B illustrate an operation when a positive voltage is applied to the gate electrode 35, and FIGS. 5A and 5B illustrate an operation when a negative voltage is applied to the gate electrode 35.

For example, when a power supply is connected between the second electrode film 11 and the third electrode 43 with the first electrode film 10 at a ground potential, the second electrode film 11 at a high potential side, and the third electrode 43 at a low potential side, in the n-channel transistor 33, a reverse bias is applied to a pn junction (parasitic diode) between the $n^+$ type surface region 28 and the $p^-$ type base region 26. On the other hand, in the p-channel transistor 32, a reverse bias is applied to a pn junction (parasitic diode) between the $p^+$ type surface region 27 and the $n^-$ type base region 25. At this time, when a control voltage (absolute value) lower than threshold voltages of the n-channel transistor 33 and the p-channel transistor 32 is applied to the gate electrode 35, no current path is formed between the first electrode film 10 and the third electrode 43 and between the second electrode film 11 and the third electrode 43.

From this state, for example, when a positive voltage (Vg>0) greater than or equal to the threshold voltage of the n-channel transistor 33 is applied to the gate electrode 35, referring to FIGS. 4A and 4B, electrons are attracted to the second channel region 31 to form an inversion layer (channel). Thus, the $n^+$ type surface region 28 and the $n^-$ type base region 25 are electrically conducted. That is, a current path from the second electrode film 11 to the third electrode 43 through the $n^+$ type surface region 28, the inversion layer (the second channel region 31), and the $n^-$ type base region 25 in this order is formed. That is, the semiconductor device 3 is turned on.

On the other hand, for example, when a negative voltage (Vg<0) less than or equal to the threshold voltage of the p-channel transistor 32 is applied to the gate electrode 35, holes are attracted to the first channel region 30 to form an inversion layer (channel). Thus, the $p^+$ type surface region 27 and the $p^-$ type base region 26 are electrically conducted. That is, a current path from the third electrode 43 to the first electrode film 10 through the $p^-$ type base region 26, the inversion layer (the first channel region 30), and the $p^+$ type surface region 27 in this order is formed. That is, the semiconductor device 3 is turned on.

Since the switching of the n-channel transistor 33 and the p-channel transistor 32 can be quickly performed only by inverting the polarity of the voltage applied to the gate electrode 35 between positive and negative in this manner, it is possible to shorten a dead time occurring between ON of the n-channel transistor 33 and ON of the p-channel transistor 32. Therefore, since the time for which an OFF voltage is applied between the first surface 22 and the second surface 23 of the semiconductor layer 24 can be shortened, it is possible to provide a semiconductor device of a lower withstand voltage design compared with the related art. Thus, since the thickness of the semiconductor layer 24 can be reduced, it is possible to reduce on-resistance of the semiconductor device 3.

Furthermore, in the semiconductor package 1 including such a semiconductor device 3, an element capable of alternately turning on and off a high-side switch and a low-side switch in, for example, an inverter circuit can be realized in a four-terminal package.

In addition, according to the semiconductor device 3, the impurity concentrations of the n-type surrounding region 36 and the p-type surrounding region 38 are selectively increased in the $n^-$ type base region 25 and the $p^-$ type base region 26, respectively. Therefore, the impurity concentrations of the first channel region 30 and the second channel region 31 are increased. Thus, it is possible to provide a time delay until the inversion layer is formed in the first channel region 30 and the second channel region 31. Accordingly, it is possible to prevent both the p-channel transistor 32 and the n-channel transistor 33 from being turned on when the gate voltage crosses 0 V, which is a boundary between a positive value and a negative value.

Furthermore, the distance between the first surface region and the second base region is relatively short at a portion sandwiching the first surrounding region. Therefore, by increasing the impurity concentration of the first surrounding region, it is possible to suppress occurrence of a phenomenon (bipolar action) that an overcurrent flows through a parasitic bipolar transistor formed by the first surface region (second conductivity type)—the first base region (first conductivity type)—the second base region (second conductivity type).

Furthermore, the distance between the $n^+$ type surface region 28 and the $n^-$ type base region 25 is relatively short at a portion sandwiching the p-type surrounding region 38 and the distance between the $p^+$ type surface region 27 and the $p^-$ base region 26 is relatively short at a portion sandwiching the n-type surrounding region 36. Therefore, by increasing the impurity concentrations of the n-type surrounding region 36 and the p-type surrounding region 38, it is possible to suppress occurrence of a phenomenon (bipolar action) that an overcurrent flows through a parasitic bipolar transistor (an npn transistor) formed by the $n^+$ type surface region 28—the $p^-$ type base region 26—the $n^-$ type base region 25 and through a parasitic bipolar transistor (pnp transistor) constituted by the $p^+$ type surface region 27—the $n^-$ type base region 25—the $p^-$ type base region 26.

Next, how the current flow of the semiconductor device 3 varies depending on the magnitude of the gate voltage is illustrated in simulation.

Figure 6:
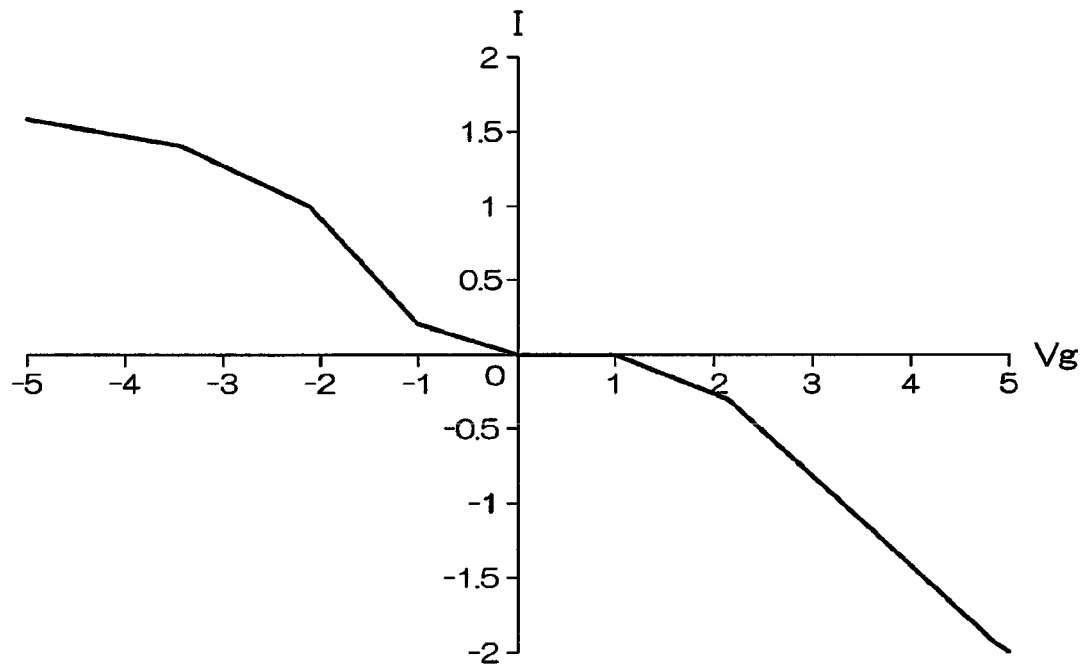
FIG. 6 is a simulation result illustrating a current flow of the semiconductor device in FIG. 2.
Figure 7:
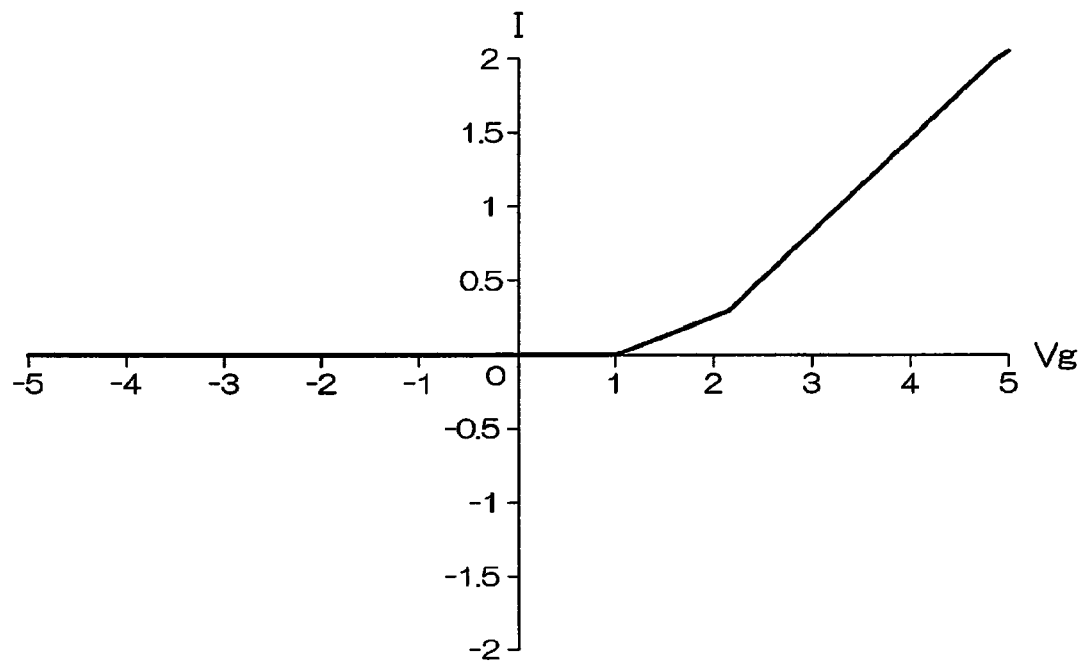
FIG. 7 is a simulation result illustrating a current flow of the semiconductor device in FIG. 2.
Figure 8:
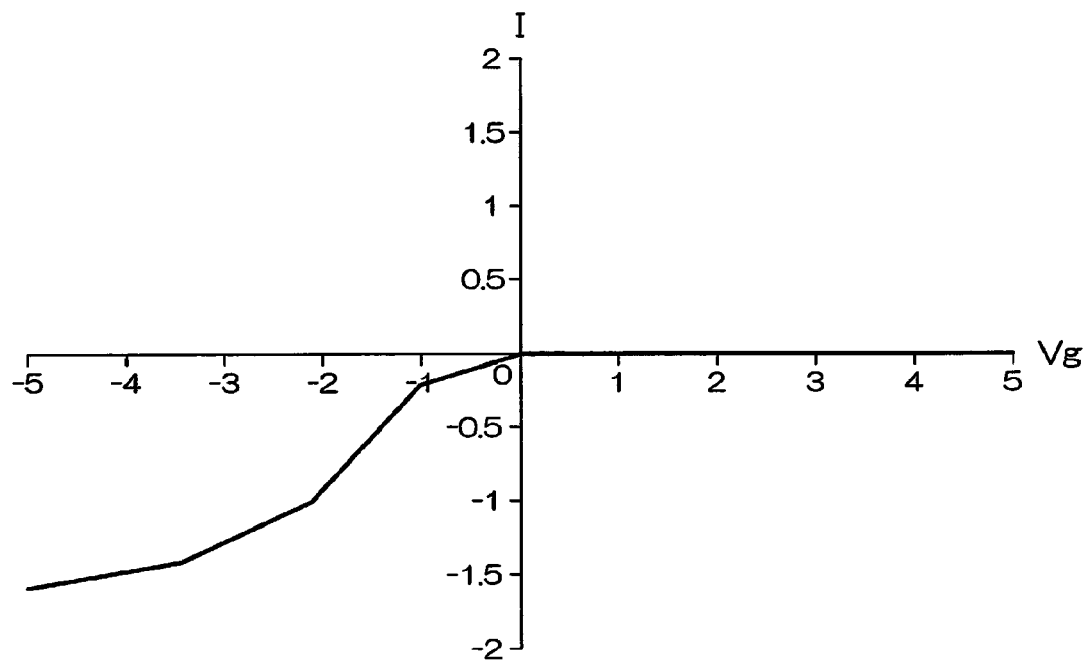
FIG. 8 is a simulation result illustrating a current flow of the semiconductor device in FIG. 2.

FIGS. 6 to 8 are simulation results illustrating the current flow of the semiconductor device 3 in FIG. 2. FIG. 6 illustrates a relationship between the gate voltage and the current flowing through the third electrode 43, FIG. 7 illustrates a relationship between the gate voltage and the current flowing through the second electrode film 11, and FIG. 8 illustrates a relationship between the gate voltage and the current flowing through the first electrode film 10.

In the simulation, the first electrode film 10 was fixed at a ground potential (0 V), the second electrode film 11 was fixed at 2 V, and the third electrode 43 was fixed at 1 V, and positive and negative gate voltages were applied.

First, as can be seen from FIG. 6, when the gate voltage is a negative value (Vg<0), as illustrated in FIGS. 5A and 5B, a current flows in a direction (positive direction) flowing from the third electrode 43 to the p-channel transistor 32. On the other hand, when the gate voltage is a positive value (Vg>0), as illustrated in FIGS. 4A and 4B, a current flows in a direction (negative direction) flowing out from the n-channel transistor 33 to the third electrode 43. Thus, it has been proved that, in the semiconductor device 3, the positive/negative switching of the current can be performed by inverting the positive and negative of the gate voltage.

In addition, referring to FIG. 7, it has been proved that, when the gate voltage is a positive value (Vg>0), the current flowing through the third electrode 43 flows from the second electrode film 11, and, referring to FIG. 8, when the gate voltage is a negative value (Vg<0), the current flowing through the third electrode 43 was directed toward the first electrode film 10. Thus, it could be confirmed that both the p-channel transistor 32 and the n-channel transistor 33 are not simultaneously turned on at the time when the positive/negative of the gate voltage is switched.

Figure 9:
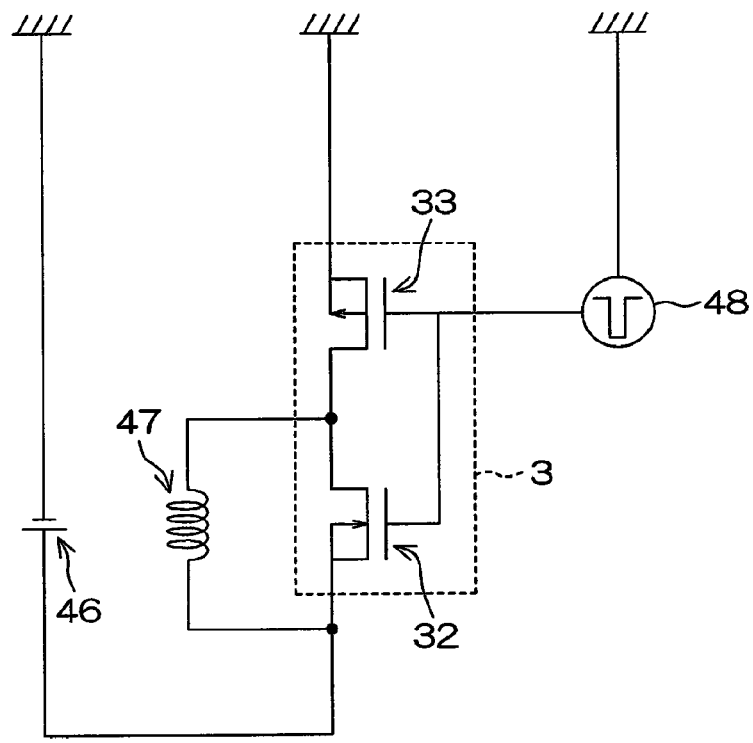
FIG. 9 is a diagram illustrating a half-bridge circuit adopted in a double pulse test.

Next, a switching waveform of the semiconductor device 3 was confirmed by a double pulse test. More specifically, a half-bridge circuit illustrated in FIG. 9 was established. In the test, a DC power supply of 100 V and 2 A was used as a DC power supply 46 and an inductor of L=1 mH was used as an air core inductor 47. Then, the test was conducted by outputting a power supply voltage of 30 V from a pulse power supply 48 with a pulse width of 5 μs and a pulse-to-pulse time of 5 μs, and supplying the same to the gates of the p-channel transistor 32 and the n-channel transistor 33. As a result, it could be confirmed that the DC current was converted to an AC current.

Figure 10:
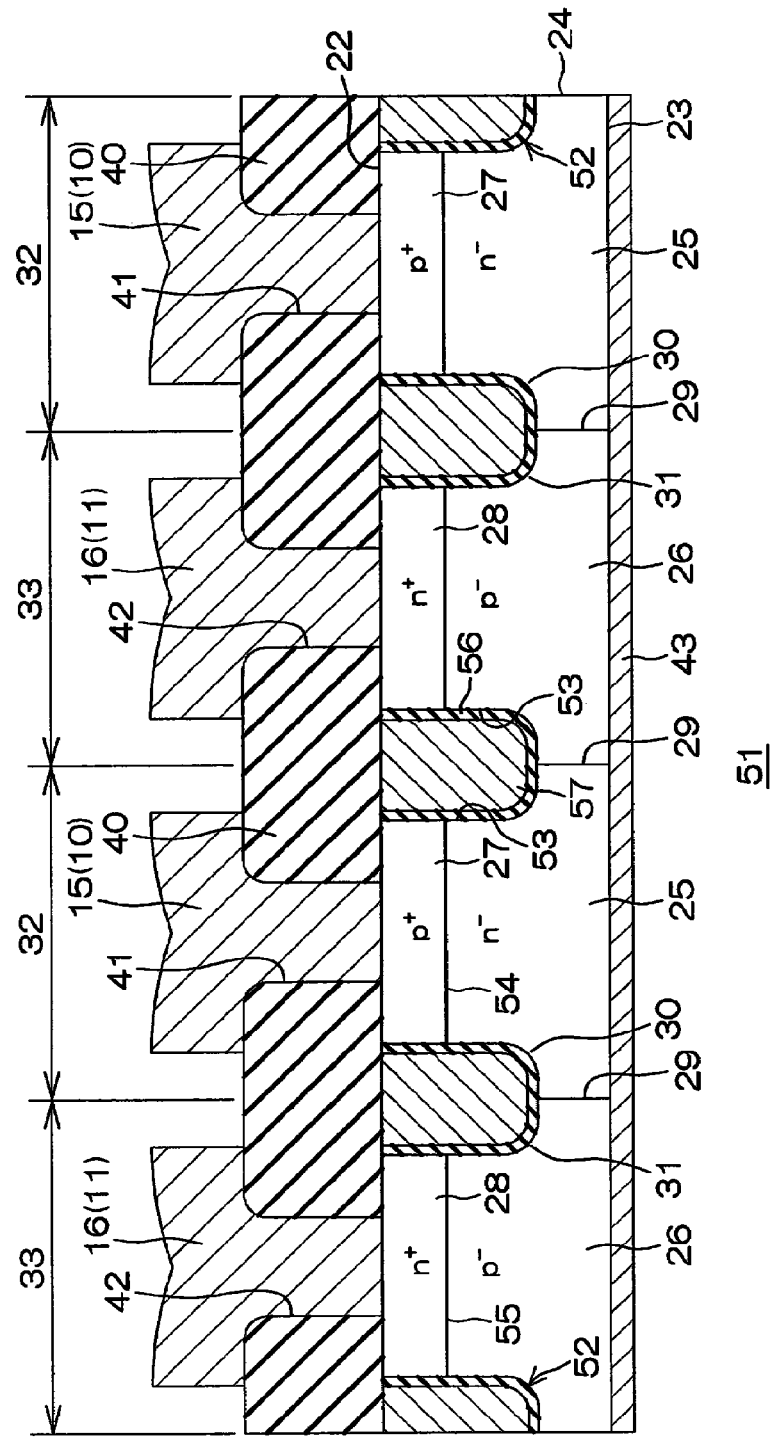
FIG. 10 is a schematic cross-sectional view of a semiconductor device according to another embodiment of the present disclosure.

FIG. 10 is a schematic cross-sectional view of a semiconductor device 51 according to another embodiment of the present disclosure. In FIG. 10, the elements corresponding to those in FIG. 2 described above are denoted by like reference numerals and a description thereof will be omitted.

In the semiconductor device 51, gate trenches 52 are formed in a semiconductor layer 24. Each of the gate trenches 52 is formed up to a middle portion of the semiconductor layer 24 in a thickness direction from a first surface 22 to a second surface 23 of the semiconductor layer 24 so as to extend across a boundary 29 between an $n^-$ type base region 25 and a $p^-$ type base region 26. The boundary 29 extends from the bottom of the gate trench 52 to the second surface 23 of the semiconductor layer 24.

Accordingly, a $p^+$ type surface region 27 and an $n^-$ type base region 25 are sequentially exposed on one side of mutually opposite side surfaces 53 of the gate trench 52 from the first surface 22 of the semiconductor layer 24. On the other hand, an $n^+$ type surface region 28 and the $p^-$ type base region 25 are sequentially exposed on the other side of the mutually opposite side surfaces 53 of the gate trench 52 from the first surface 22 of the semiconductor layer 24. That is, the $p^+$ type surface region 27 and the $n^+$ type surface region 28 face each other with the gate trench 52 interposed therebetween, and the $n^-$ type base region 25 and the $p^-$ type base region 26 face each other thereunder with the gate trench 52 interposed therebetween. The $p^+$ type surface region 27 and the $n^+$ type surface region 28 are exposed on the first surface 22 of the semiconductor layer 24 and the $n^-$ type base region 25 and the $p^-$ type base region 26 form the bottom of the gate trench 52.

In the semiconductor device 51, a region from a boundary 54 between the $p^+$ type surface region 27 and the $n^-$ type base region 25 to the boundary 29 at the bottom of the gate trench 52 along the side surface 53 of the gate trench 52 in the $n^-$ type base region 25 defines a first channel region 30. A region along the inner surface of the gate trench 52 including the first channel region 30 may be a region having a selectively high impurity concentration, like the n-type surrounding region 36 described above.

In addition, a region from a boundary 55 between the $n^+$ type surface region 28 and the $p^-$ type base region 26 to the boundary 29 at the bottom of the gate trench 52 along the side surface 53 of the gate trench 52 in the $p^-$ type base region 26 defines a second channel region 31. A region along the inner surface of the gate trench 52 including the second channel region 31 may be a region having a selectively high impurity concentration, like the p-type surrounding region 38 described above.

A gate electrode 57 is embedded in the gate trench 52 with a gate insulating film 56 interposed therebetween. The gate electrode 57 faces the $p^+$ type surface region 27, the first channel region 30, the second channel region 31, and the $n^+$ type surface region 28 exposed in the gate trench 52. That is, the gate electrode 57 is formed so as to control a p-channel transistor 32 and an n-channel transistor 33 in common. Thus, a trench gate structure is formed.

Also in this semiconductor device 51, since the switching between the n-channel transistor 33 and the p-channel transistor 32 can be quickly performed only by inverting the polarity of the voltage applied to the gate electrode 57 between positive and negative, it is possible to shorten a dead time occurring between ON of the n-channel transistor 33 and ON of the p-channel transistor 32. Therefore, since the time for which an OFF voltage is applied between the first surface 22 and the second surface 23 of the semiconductor layer 24 can be shortened, it is possible to provide a semiconductor device of a lower withstand voltage design compared with the related art. Thus, since the thickness of the semiconductor layer 24 can be reduced, it is possible to reduce on-resistance of the semiconductor device 51. Furthermore, since the gate structure is a trench gate structure, it is possible to miniaturize the element.

Next, a manufacturing method of the semiconductor device 51 will be described.

FIGS. 11A to 11H are views illustrating a manufacturing process of the semiconductor device 51 in the order of steps.

Figure 11A:
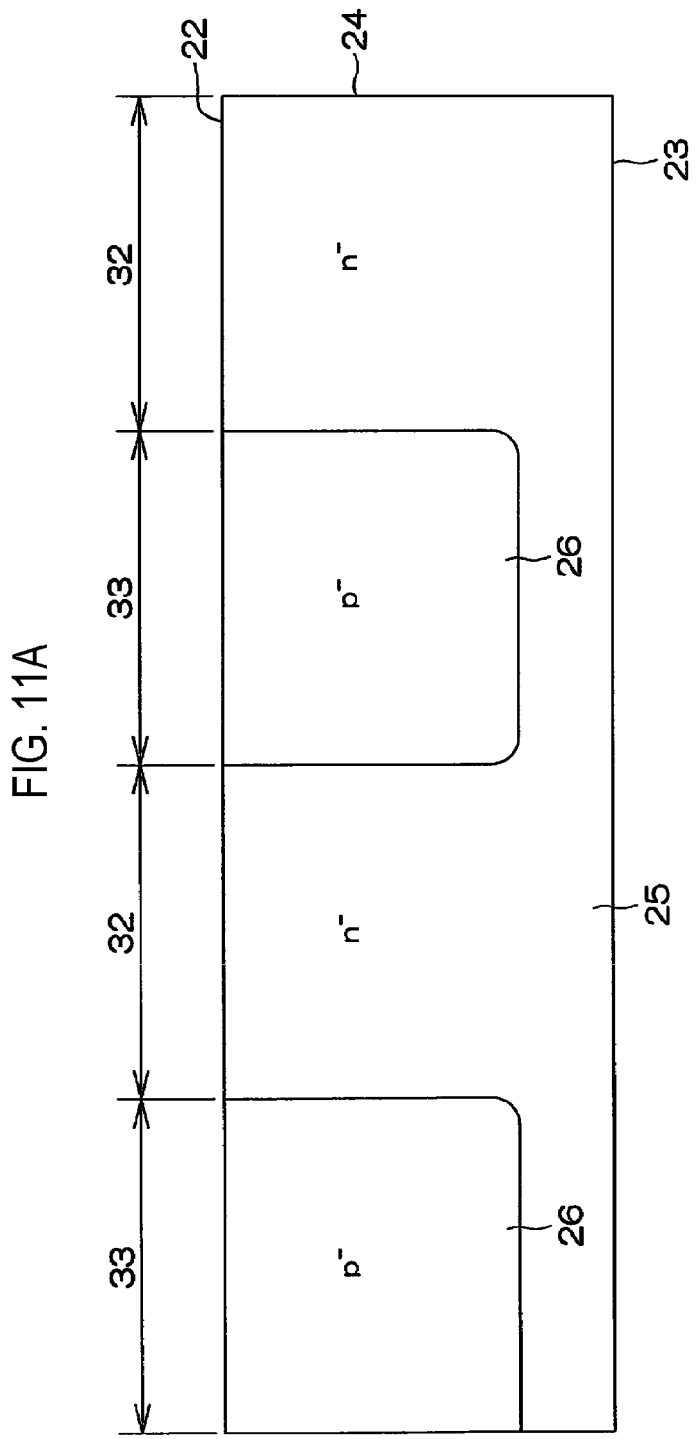
FIG. 11A is a view illustrating a part of a manufacturing process of the semiconductor device in FIG. 10.

To manufacture the semiconductor device 51, for example, referring to FIG. 11A, a p-type impurity is selectively implanted into a first surface 22 of a formation region of an n-channel transistor 33 of a $n^-$ type semiconductor layer 24. Thereafter, a $p^-$ type base region 26 is formed by performing an annealing treatment (1,000 to 1,200 degrees C.). A region of an $n^-$ type semiconductor layer 24 other than the $p^-$ type base region 26 is formed as an $n^-$ type base region 25. In this state, the $p^-$ type base region 26 is selectively formed on a surface portion of the semiconductor layer 24, and an $n^-$ type base region 25 spreads between the $p^-$ type base region 26 and a second surface 23 of the semiconductor layer 24. That is, the entire second surface 23 of the semiconductor layer 24 is formed as the $n^-$ type base region 25.

Next, referring to FIG. 11B, thinning is performed by removing (for example, grinding, polishing, or the like) the semiconductor layer 24 from the second surface 23. This thinning is performed until the $p^-$ type base region 26 is exposed on the second surface 23 of the semiconductor layer 24. Thus, the $n^-$ type base regions 25 on the second surface 23 side of the semiconductor layer 24 are removed from the $p^-$ type base region 26, and the $n^-$ type base regions 25 and the $p^-$ type base regions 26 in the stripe form are formed in the semiconductor layer 24.

Figure 11C:
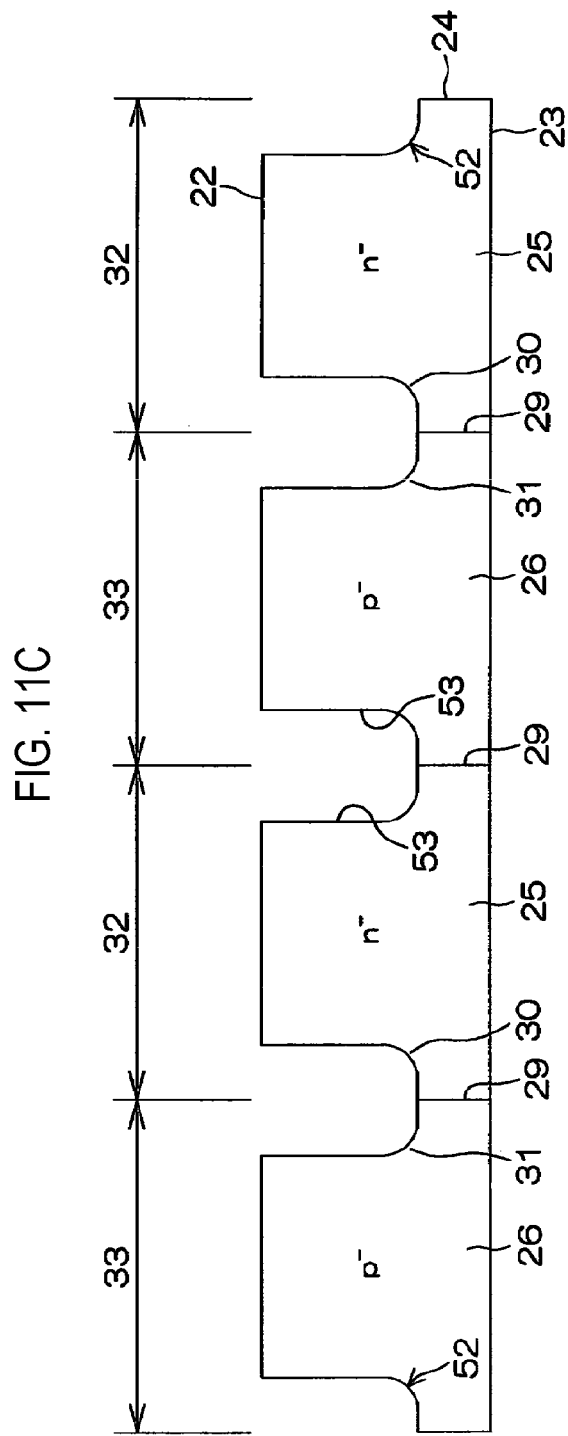
FIG. 11C is a view illustrating a next step of FIG. 11B.

Next, as illustrated in FIG. 11C, the semiconductor layer 24 is selectively removed from the first surface 22 so as to form a gate trench 52. The removing method may be, for example, a dry etching. In the case where the impurity concentration of a region along the inner surface of the gate trench 52 of the $n^-$ type base region 25 and the $p^-$ type base region 26 is selectively increased, an n-type impurity and a p-type impurity may be further implanted into the corresponding regions, respectively, after the formation of the gate trench 52.

Next, referring to FIG. 11D, a gate insulating film 56 is formed on the inner surface of the gate trench 52. The gate insulating film 56 may be formed by thermal oxidation of a semiconductor crystal surface.

Next, referring to FIG. 11E, a material of a gate electrode 57 (polysilicon in this embodiment) is deposited on the semiconductor layer 24 while adding an impurity, and then the deposited polysilicon layer is etched back. Thus, the gate electrode 57 is embedded in the gate trench 52.

Figure 11F:
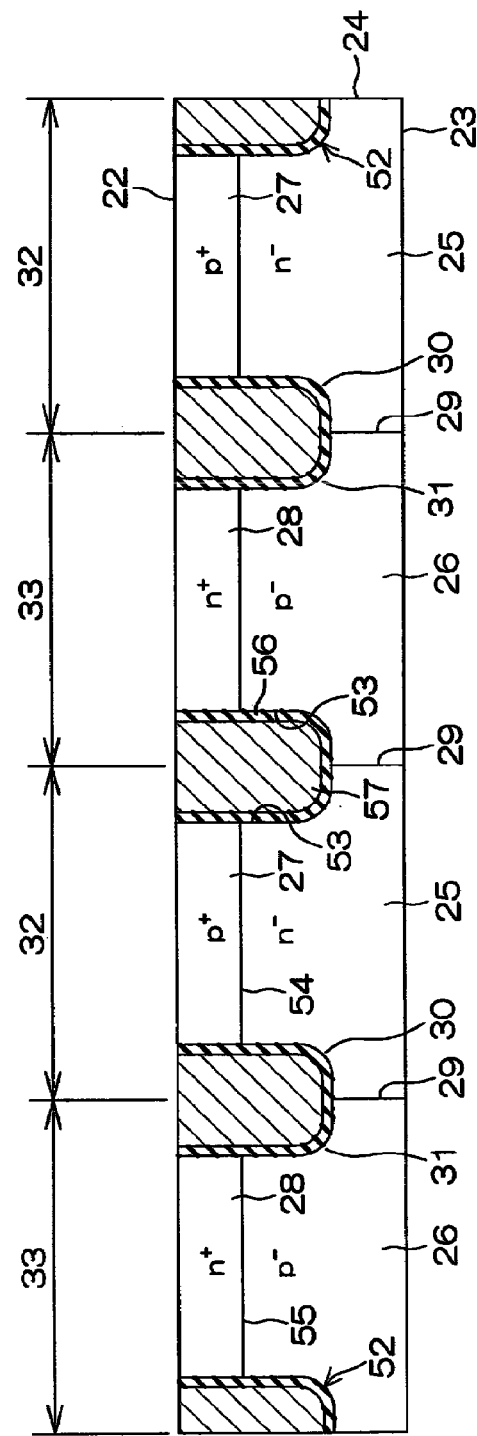
FIG. 11F is a view illustrating a next step of FIG. 11E.

Next, referring to FIG. 11F, a p-type impurity is selectively implanted into the first surface 22 of a formation region of a p-channel transistor 32. Furthermore, an n-type impurity is selectively implanted into the first surface 22 of the formation region of the n-channel transistor 33. Thereafter, a $p^+$ type surface region 27 and an $n^+$ type surface region 28 are formed by performing an annealing treatment (1,000 to 1,200 degrees C.).

Figure 11G:
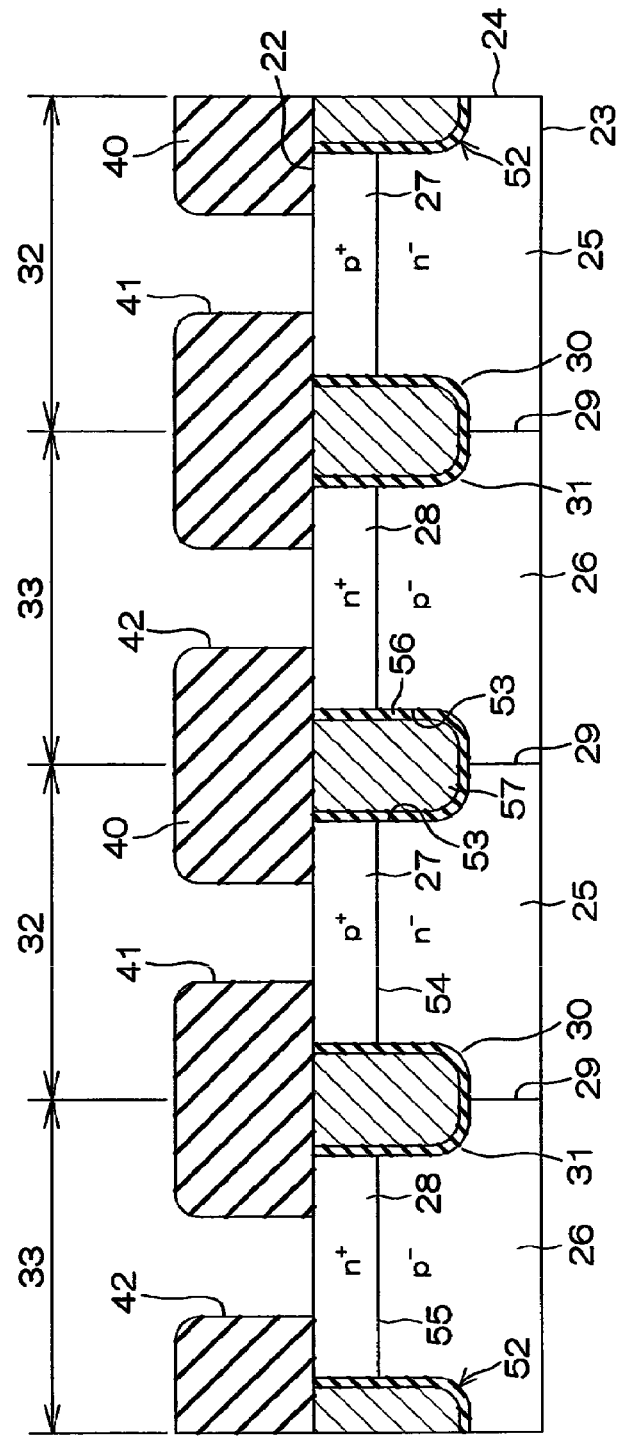
FIG. 11G is a view illustrating a next step of FIG. 11F.

Next, referring to FIG. 11G, an interlayer insulating film 40 is formed so as to cover the gate electrode 57, and contact holes 41 and 42 are formed in the interlayer insulating film 40 by photolithography.

Figure 11H:
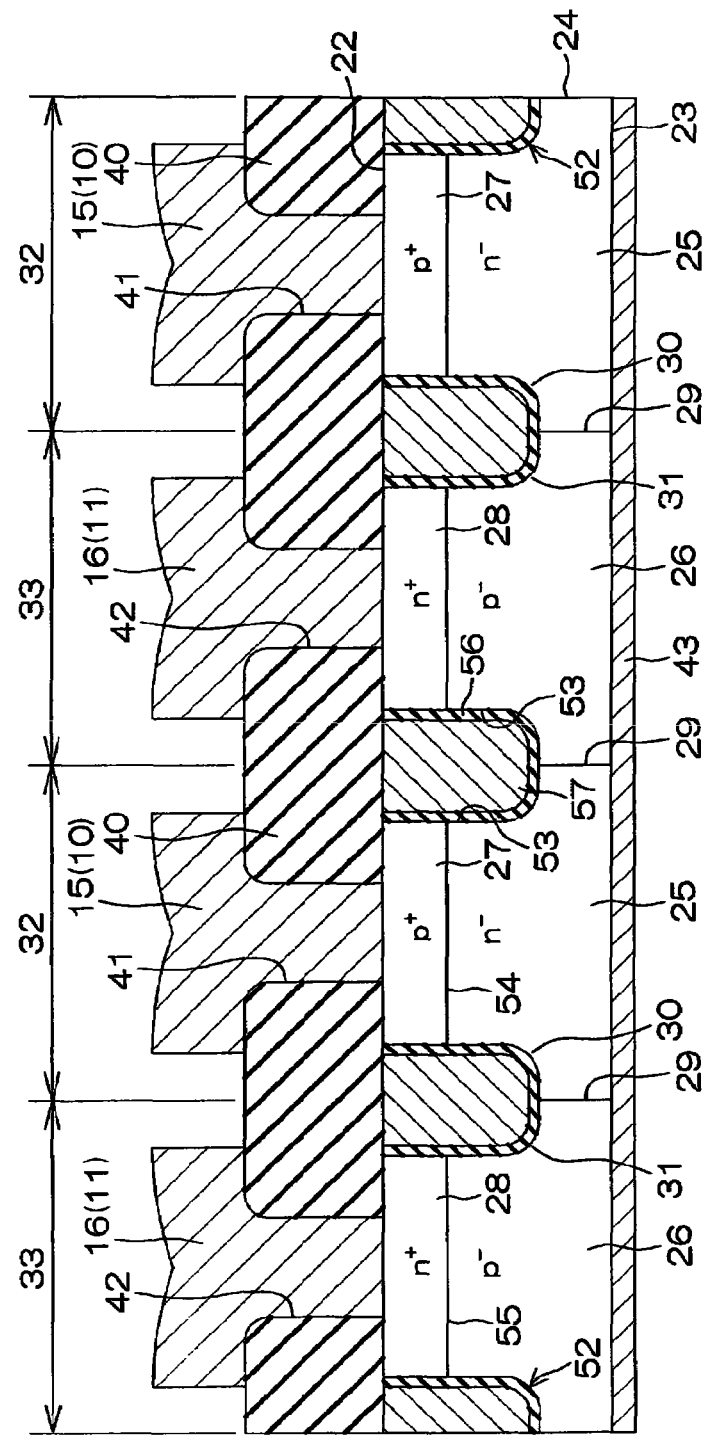
FIG. 11H is a view illustrating a next step of FIG. 11G.

Next, referring to FIG. 11H, a first electrode film 10, a second electrode film 11, and a gate electrode film 12 (not shown) are formed as surface metals on the interlayer insulating film 40. Thereafter, the aforementioned semiconductor device 51 can be obtained by forming a third electrode 43 on the second surface 23 of the semiconductor layer 24.

Although the embodiments of the present disclosure have been described above, the present disclosure may be implemented in other forms.

For example, a configuration in which the conductivity types of the respective semiconductor parts of the semiconductor devices 3 and 51 are reversed may be adopted. For example, in the semiconductor devices 3 and 51, the p-type portion may be an n-type portion and the n-type portion may be a p-type portion.

According to the present disclosure in some embodiments, it is possible to provide a semiconductor device capable of shortening a dead time and reducing on-resistance, and a manufacturing method thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a semiconductor layer having a first surface and a second surface opposite the first surface;
   a first base region of a first conductivity type formed in the semiconductor layer;
   a second base region of a second conductivity type adjacent to the first base region and formed in the semiconductor layer;
   at least one first surface region of the second conductivity type selectively formed in the first base region separate from the second base region;
   at least one second surface region of the first conductivity type selectively formed in the second base region separate from the first base region;
   a gate electrode configured to face a portion of the first base region between a boundary between the first base region and the second base region and the at least one first surface region and a portion of the second base region between the boundary and the at least one second surface region, the gate electrode extending across the boundary between the first base region and the second base region;
   a first electrode electrically connected to the at least one first surface region;
   a second electrode electrically connected to the at least one second surface region; and
   a third electrode electrically connected in common to the first base region and the second base region.

2. The device of claim 1, wherein the at least one first surface region is selectively formed on the first surface of the first base region,
   wherein the first base region includes a first surrounding region surrounded by the boundary between the first base region and the second base region, the gate electrode, and the at least one first surface region, and
   wherein the first surrounding region has an impurity concentration higher than that of a region of the first base region other than the first surrounding region.

3. The device of claim 2, wherein the impurity concentration of the first surrounding region is $1.0 \times 10^{14}$ to $1.0 \times 10^{16}$ $cm^{-3}$, and the impurity concentration of the region of the first base region other than the first surrounding region is $1.0 \times 10^{13}$ to $1.0 \times 10^{15}$ $cm^{-3}$.

4. The device of claim 1, wherein the at least one second surface region is selectively formed on the first surface of the second base region,
   wherein the second base region includes a second surrounding region surrounded by the boundary between the first base region and the second base region, the gate electrode, and the at least one second surface region, and
   wherein the second surrounding region has an impurity concentration higher than that of a region of the second base region other than the second surrounding region.

5. The device of claim 4, wherein the impurity concentration of the second surrounding region is $1.0 \times 10^{14}$ to $1.0 \times 10^{16}$ $cm^{-3}$, and the impurity concentration of the region of the second base region other than the second surrounding region is $1.0 \times 10^{13}$ to $1.0 \times 10^{15}$ $cm^{-3}$.

6. The device of claim 1, wherein both the first base region and the second base region are formed so as to be exposed on the second surface of the semiconductor layer, and
   wherein the third electrode is formed in the second surface of the semiconductor layer so as to extend across the boundary between the first base region and the second base region.

7. The device of claim 1, wherein the gate electrode includes a gate electrode of a planar gate structure.

8. The device of claim 1, wherein the gate electrode includes a gate electrode of a trench gate structure.

9. The device of claim 1, wherein the at least one first surface region includes a plurality of first surface regions, and the at least one second surface region includes a plurality of second surface regions, and
   wherein the device has a stripe structure in which the plurality of first surface regions and the plurality of second surface regions are alternately arranged.

10. The device of claim 9, wherein the first electrode includes a first base part extending in a direction intersecting the plurality of first surface regions and a first extension part extending from the first base part along each of the plurality of first surface regions and connected to each of the plurality of first surface regions, wherein the second electrode includes a second base part extending in a direction intersecting the plurality of second surface regions and a second extension part extending from the second base part along each of the plurality of second surface regions and connected to each of the plurality of second surface regions, and wherein the first electrode and the second electrode are engaged with each other in a comb shape.

11. The device of claim 1, wherein the semiconductor layer has a thickness of 3 to 50 μm.

12. A semiconductor package, comprising:
the semiconductor device of claim 1;
a first terminal electrically connected to the first electrode;
a second terminal electrically connected to the second electrode;
a third terminal electrically connected to the third electrode;
a fourth terminal electrically connected to the gate electrode; and
a resin package configured to seal the semiconductor device and the first to fourth terminals.

13. A method of manufacturing a semiconductor device, comprising:
selectively implanting, into a first surface of a semiconductor layer of a first conductivity type having the first surface and a second surface opposite the first surface, an impurity of a second conductivity type to form a second base region exposed on the first surface of the semiconductor layer and a first base region including a region of the semiconductor layer other than the second base region;
exposing the first base region and the second base region on the second surface of the semiconductor layer by removing the semiconductor layer from the second surface;
forming a first surface region of the second conductivity type on the first surface of the first base region so as to be separate from the second base region;
forming a second surface region of the first conductivity type on the first surface of the second base region so as to be separate from the first base region;
forming a gate electrode configured to face a portion of the first base region between a boundary between the first base region and the second base region and the first surface region and a portion of the second base region between the boundary and the second surface region so as to extend across the boundary between the first base region and the second base region;
forming a first electrode electrically connected to the first surface region;
forming a second electrode electrically connected to the second surface region; and
forming a third electrode on the second surface of the semiconductor layer so as to extend across the boundary between the first base region and the second base region.

* * * * *